US009966724B2

(12) United States Patent
Takabayashi et al.

(10) Patent No.: US 9,966,724 B2
(45) Date of Patent: May 8, 2018

(54) LASER AND METHOD OF CONTROLLING LASER

(71) Applicant: FUJITSU LIMITED, Kawasaki-shi, Kanagawa (JP)

(72) Inventors: Kazumasa Takabayashi, Atsugi (JP); Tsuyoshi Yamamoto, Zama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days. days.

(21) Appl. No.: 15/446,303

(22) Filed: Mar. 1, 2017

(65) Prior Publication Data
US 2017/0179671 A1    Jun. 22, 2017

Related U.S. Application Data

(63) Continuation of application No. PCT/JP2014/074830, filed on Sep. 19, 2014.

(51) Int. Cl.
*H01S 3/10* (2006.01)
*H01S 3/082* (2006.01)
(Continued)

(52) U.S. Cl.
CPC .............. *H01S 3/082* (2013.01); *H01S 3/083* (2013.01); *H01S 3/08027* (2013.01);
(Continued)

(58) Field of Classification Search
CPC . H01S 5/14; H01S 5/40; H01S 5/1021; H01S 3/082; H01S 3/08027;
(Continued)

(56) References Cited

U.S. PATENT DOCUMENTS 9,748,726 B1 * 8/2017 Morton ................... H01S 3/083
2006/0198416 A1   9/2006 Yamazaki
(Continued)

FOREIGN PATENT DOCUMENTS

JP    2006-245344 A1    9/2006
JP    2009-064915 A1    3/2009
(Continued)

OTHER PUBLICATIONS

International Search Report for International Application No. PCT/JP2014/074830 dated Jan. 13, 2015.

*Primary Examiner* — Jessica Manno
*Assistant Examiner* — Delma R Forde
(74) *Attorney, Agent, or Firm* — Kratz, Quintos & Hanson, LLP

(57) ABSTRACT

A laser includes first through fourth gain media, first through fifth wavelength selective filters, and first through fourth wavelength selective mirrors. The first through fourth gain media emit laser beams of different wavelengths. Each of the first through fifth wavelength selective filters includes first through fourth input/output ports. The fifth wavelength selective filter selects light of periodic wavelengths. The first through fourth wavelength selective filters have their respective first input/output ports connected to the first through fourth gain media, respectively, have their respective fourth input/output ports connected to the first through fourth wavelength selective mirrors, respectively, and have their respective second input/output ports connected to the first through fourth input/output ports, respectively, of the fifth wavelength selective filter.

25 Claims, 20 Drawing Sheets

(51) Int. Cl.
- *H01S 5/14* (2006.01)
- *H01S 5/40* (2006.01)
- *H01S 3/08* (2006.01)
- *H01S 3/083* (2006.01)
- *H01S 3/13* (2006.01)
- *H04J 14/02* (2006.01)

(52) U.S. Cl.
CPC ........ *H01S 3/08086* (2013.01); *H01S 3/1305* (2013.01); *H01S 5/14* (2013.01); *H01S 5/40* (2013.01); *H04J 14/02* (2013.01)

(58) Field of Classification Search
CPC .... H01S 3/08086; H01S 3/083; H01S 3/1305; H01S 3/137; H01S 3/2391; H04J 14/02
See application file for complete search history.

(56) References Cited

U.S. PATENT DOCUMENTS

| | | | |
|---|---|---|---|
| 2008/0166134 A1* | 7/2008 | McCallion | G02B 6/12007 398/187 |
| 2009/0046748 A1* | 2/2009 | Kato | H01S 5/026 372/20 |
| 2009/0059973 A1 | 3/2009 | Suzuki | |
| 2009/0122817 A1* | 5/2009 | Sato | G02B 6/12007 372/20 |
| 2009/0226127 A1* | 9/2009 | Heideman | B01L 3/5027 385/12 |
| 2009/0285251 A1* | 11/2009 | Yamazaki | G02B 6/12007 372/34 |
| 2010/0034224 A1 | 2/2010 | Takabayashi | |
| 2010/0150496 A1* | 6/2010 | Heideman | B01L 3/5027 385/12 |
| 2010/0284649 A1 | 11/2010 | Ishii | |
| 2011/0235659 A1 | 9/2011 | Fukuda | |
| 2011/0310917 A1* | 12/2011 | Krishnamoorthy | H01S 5/1096 372/23 |
| 2012/0189025 A1* | 7/2012 | Zheng | H01S 5/1071 372/20 |
| 2015/0303653 A1* | 10/2015 | Tanaka | G02B 6/1228 398/200 |
| 2015/0381301 A1* | 12/2015 | Jeong | G02B 6/29397 398/79 |
| 2016/0072255 A1* | 3/2016 | Krishnamoorthy | H01S 5/1096 372/23 |
| 2016/0329983 A1* | 11/2016 | Baehr-Jones | H04J 14/02 |
| 2016/0336718 A1* | 11/2016 | Takabayashi | H01S 5/0612 |
| 2017/0098921 A1* | 4/2017 | Takabayashi | H01S 5/142 |
| 2017/0223437 A1* | 8/2017 | Lee | G05B 19/00 |

FOREIGN PATENT DOCUMENTS

| | | |
|---|---|---|
| JP | 2010-040927 A1 | 2/2010 |
| JP | 2010-087472 A1 | 4/2010 |
| JP | 2010-212472 A1 | 9/2010 |
| JP | 2011-204895 A1 | 10/2011 |
| WO | 2009/096431 A1 | 8/2009 |

* cited by examiner

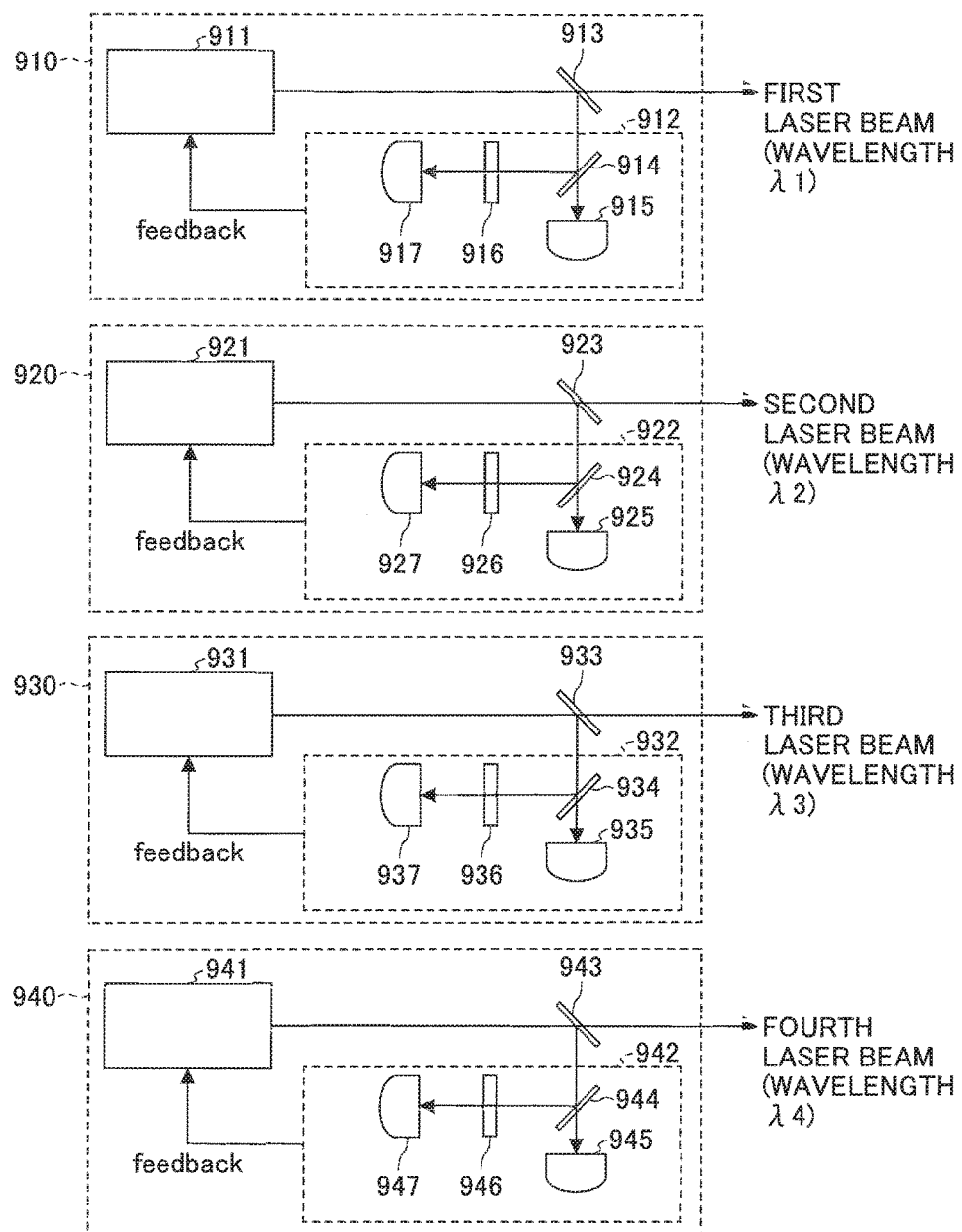

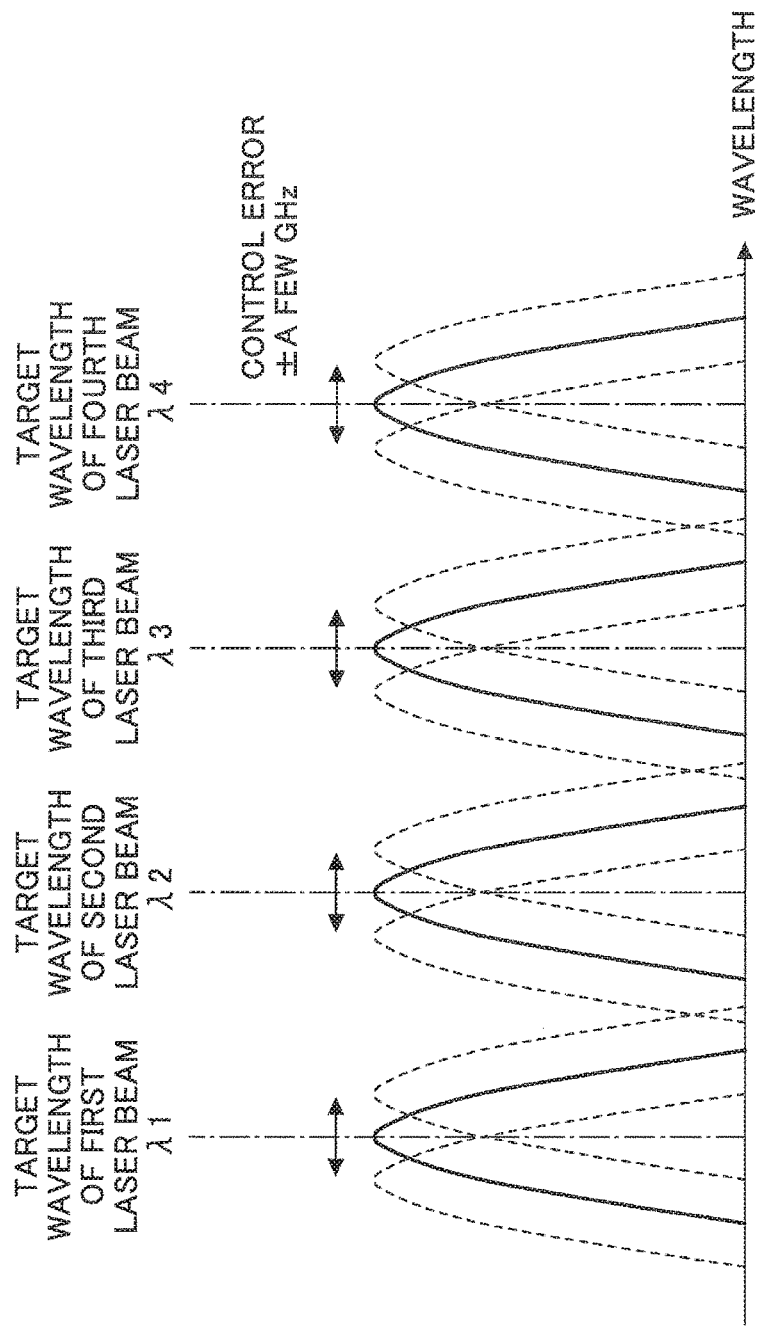

FIG.12

| OSCILLATION WAVELENGTH | FIRST LASER BEAM | SECOND LASER BEAM | THIRD LASER BEAM | FOURTH LASER BEAM |
|---|---|---|---|---|
| | $\lambda 1$ (AT WHICH RESONANT WAVELENGTHS OF FIRST RING RESONATOR 71 AND FIFTH RING RESONATOR 75 MATCH) | $\lambda 2$ (AT WHICH RESONANT WAVELENGTHS OF SECOND RING RESONATOR 72 AND FIFTH RING RESONATOR 75 MATCH) | $\lambda 3$ (AT WHICH RESONANT WAVELENGTHS OF THIRD RING RESONATOR 73 AND FIFTH RING RESONATOR 75 MATCH) | $\lambda 4$ (AT WHICH RESONANT WAVELENGTHS OF FOURTH RING RESONATOR 74 AND FIFTH RING RESONATOR 75 MATCH) |
| RING RESONATOR WHOSE RESONANT WAVELENGTH COINCIDES | FIRST RING RESONATOR 71 | SECOND RING RESONATOR 72 | THIRD RING RESONATOR 73 | FOURTH RING RESONATOR 74 |
| RING RESONATOR WHOSE RESONANT WAVELENGTH DOES NOT COINCIDE | SECOND RING RESONATOR 72 AND THIRD RING RESONATOR 73 | FIRST RING RESONATOR 71 AND FOURTH RING RESONATOR 74 | FIRST RING RESONATOR 71 AND FOURTH RING RESONATOR 74 | SECOND RING RESONATOR 72 AND THIRD RING RESONATOR 73 |
| WAVELENGTH SELECTIVE MIRROR WHOSE SELECTED WAVELENGTH COINCIDES | SECOND WAVELENGTH SELECTIVE MIRROR 62 (SEVENTH RING RESONATOR 77) | FIRST WAVELENGTH SELECTIVE MIRROR 61 (SIXTH RING RESONATOR 76) | FOURTH WAVELENGTH SELECTIVE MIRROR 64 (NINTH RING RESONATOR 79) | THIRD WAVELENGTH SELECTIVE MIRROR 63 (EIGHTH RING RESONATOR 78) |
| WAVELENGTH SELECTIVE MIRROR WHOSE SELECTED WAVELENGTH DOES NOT COINCIDE | THIRD WAVELENGTH SELECTIVE MIRROR 63 (EIGHTH RING RESONATOR 78) | FOURTH WAVELENGTH SELECTIVE MIRROR 64 (NINTH RING RESONATOR 79) | FIRST WAVELENGTH SELECTIVE MIRROR 61 (SIXTH RING RESONATOR 76) | SECOND WAVELENGTH SELECTIVE MIRROR 62 (SEVENTH RING RESONATOR 77) |

LASER AND METHOD OF CONTROLLING LASER

CROSS-REFERENCE TO RELATED APPLICATION

This application is a continuation application of International Application PCT/JP2014/074830, filed on Sep. 19, 2014, and designating the U.S., the entire contents of which are incorporated herein by reference.

FIELD

A certain aspect of the embodiments discussed herein is related to lasers and methods of controlling a laser.

BACKGROUND

In trunk-line optical communication systems, large-capacity optical transmission is performed using a wavelength division multiplexing communications system. Multiple optical signals of different wavelengths are transmitted through a single fiber in this system. In such a wavelength division multiplexing communications system, a tunable laser capable of varying an oscillation wavelength within a broad wavelength range is indispensable. In the wavelength division multiplexing communications, predetermined wavelength channels (an ITU-T grid) are set, and the wavelength of each tunable laser is tuned to each wavelength channel.

The transmission capacity of a wavelength division multiplexing communications system is the product of a bit rate per wavelength channel and the number of wavelength channels, and the transmission capacity increases as the number of wavelength channels increases. The number of wavelength channels is determined by an employed wavelength range (for example, a wavelength range of 1525 nm to 1565 nm referred to as "C-band") and the wavelength spacing (interval) of wavelength channels. Accordingly, even in the same wavelength range, it is possible to increase the number of wavelength channels and accordingly to increase the transmission capacity by reducing the wavelength spacing.

In the present wavelength division multiplexing communications systems, the modulation baud rate of each wavelength is 10 Gbaud or 25 Gbaud, and as depicted in FIG. 1A, the wavelength spacing is set to 50 GHz (approximately 0.4 nm). In contrast, in next-generation wavelength division multiplexing communications systems, it has been under study to increase the transmission capacity by reducing the wavelength interval to the same value as the modulation baud rate, which is a physical limit, using the Nyquist method or optical orthogonal frequency-division multiplexing (optical OFDM). Specifically, as depicted in FIG. 1B, it has been under study to increase the transmission capacity by reducing the wavelength interval to the same value as the modulation baud rate, which is a physical limit, namely, 25 GHz in the case of 25 Gbaud.

Reference may be made to Japanese Laid-open Patent Publication No. 2006-245344 for related art.

SUMMARY

According to an aspect of the embodiments, a laser includes a first gain medium, a first partially reflecting mirror provided at a first end face of the first gain medium, a second gain medium, a second partially reflecting mirror provided at a first end face of the second gain medium, a third gain medium, a third partially reflecting mirror provided at a first end face of the third gain medium, a fourth gain medium, a fourth partially reflecting mirror provided at a first end face of the fourth gain medium, a first wavelength selective filter, a second wavelength selective filter, a third wavelength selective filter, a fourth wavelength selective filter, a fifth wavelength selective filter, a first wavelength selective mirror, a second wavelength selective mirror, a third wavelength selective mirror, and a fourth wavelength selective mirror. Each of the first wavelength selective filter, the second wavelength selective filter, the third wavelength selective filter, the fourth wavelength selective filter, and the fifth wavelength selective filter includes a first input/output port, a second input/output port, a third input/output port, and a fourth input/output port. The first input/output port and the second input/output port are connected and the third input/output port and the fourth input/output port are connected with respect to selected light that is selected wavelengths, and the first input/output port and the third input/output port are connected and the second input/output port and the fourth input/output port are connected with respect to non-selected light. The fifth wavelength selective filter is configured to select lights of periodic wavelengths. The first input/output port of the first wavelength selective filter is connected to a second end face of the first gain medium. The first input/output port of the second wavelength selective filter is connected to a second end face of the second gain medium. The first input/output port of the third wavelength selective filter is connected to a second end face of the third gain medium. The first input/output port of the fourth wavelength selective filter is connected to a second end face of the fourth gain medium. The first wavelength selective mirror is connected to the fourth input/output port of the first wavelength selective filter. The second wavelength selective mirror is connected to the fourth input/output port of the second wavelength selective filter. The third wavelength selective mirror is connected to the fourth input/output port of the third wavelength selective filter. The fourth wavelength selective mirror is connected to the fourth input/output port of the fourth wavelength selective filter. The second input/output port of the first wavelength selective filter is connected to the first input/output port of the fifth wavelength selective filter. The second input/output port of the second wavelength selective filter is connected to the second input/output port of the fifth wavelength selective filter. The second input/output port of the third wavelength selective filter is connected to the third input/output port of the fifth wavelength selective filter. The second input/output port of the fourth wavelength selective filter is connected to the fourth input/output port of the fifth wavelength selective filter.

The object and advantages of the embodiments will be realized and attained by means of the elements and combinations particularly pointed out in the claims.

It is to be understood that both the foregoing general description and the following detailed description are exemplary and explanatory and not restrictive of the invention.

BRIEF DESCRIPTION OF THE DRAWINGS

FIG. 2 is a diagram depicting a structure of a conventional laser;

FIG. 3 is a diagram illustrating wavelength control of a conventional laser;

FIG. 12 is a table indicating the relationship between resonant wavelengths of the laser according to this embodiment;

DESCRIPTION OF EMBODIMENTS

Figure 1A:
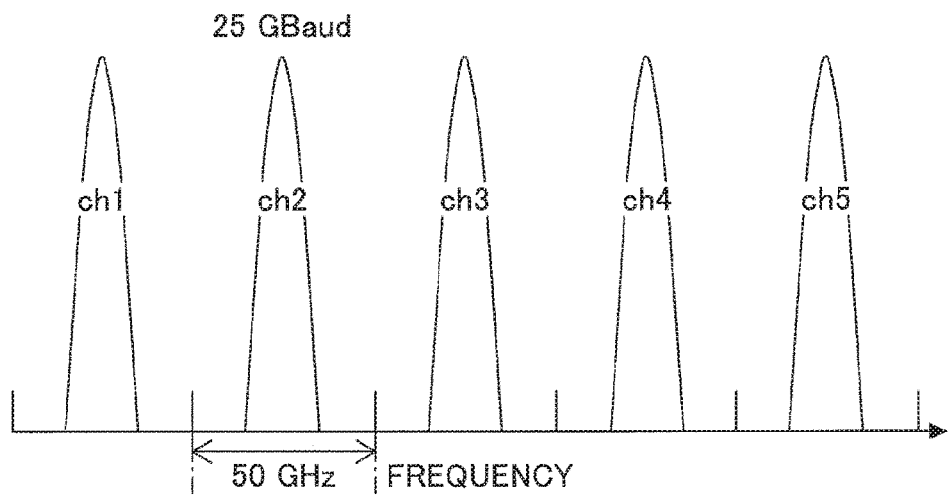
FIGS. 1A and 1B are diagrams illustrating wavelength grids of wavelength division multiplexing communications systems.
Figure 1B:
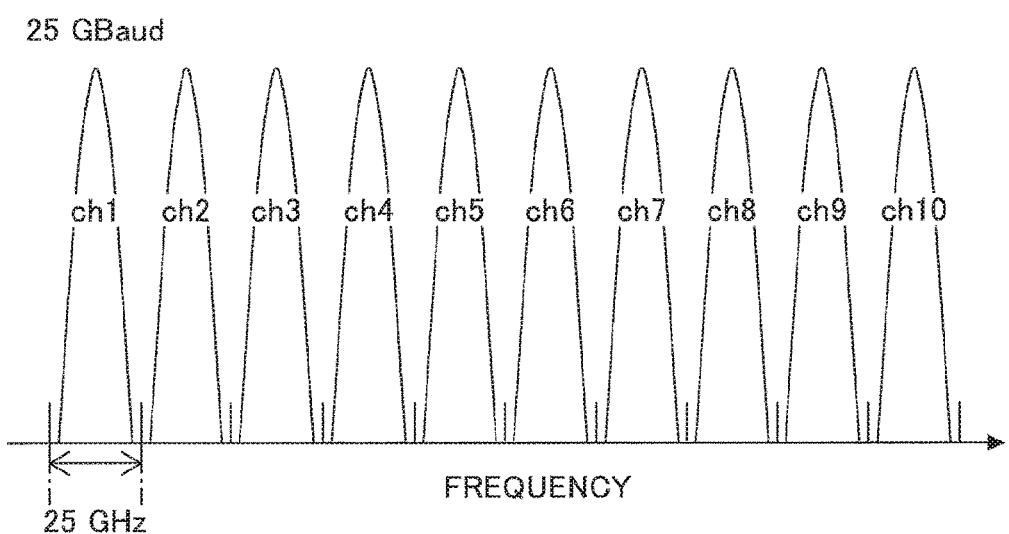

In conventional wavelength division multiplexing communications systems, laser sources for wavelength channels are provided with respective wavelength lockers to individually control the wavelengths of laser beams emitted from the laser sources, and perform wavelength control independent of each other. The wavelength locker is a device that controls a wavelength of a laser beam to a desired wavelength by monitoring part of output light with an optical detector such as a photodiode through a Fabry-Perot etalon whose transmission intensity periodically varies with respect to wavelength. In such a wavelength locker, an error of approximately a few GHz is caused by an error in the monitor value of a photodiode or an error in feedback control.

As a specific example, a description is given of a laser that includes a first laser source 910, a second laser source 920, a third laser source 930, and a fourth laser source 940, which emit four laser beams of different wavelengths, as depicted in FIG. 2.

The first laser source 910 includes a first tunable laser 911 and a first wavelength locker 912. Part of a first laser beam emitted from the first tunable laser 911 is reflected from a partially reflecting mirror 913 to enter the first wavelength locker 912. The first wavelength locker 912 includes a partially reflecting mirror 914 that splits the first laser beam that has entered the first wavelength locker 912. Of the first laser beam that has entered the first wavelength locker 912, a laser beam transmitted through the partially reflecting mirror 914 enters an optical detector 915, and a laser beam reflected from the partially reflecting mirror 914 enters an optical detector 917 through an etalon 916. Accordingly, only the laser beam transmitted through the etalon 916 is detected in the optical detector 917. The ratio of the amount of light detected by the optical detector 917 and the amount of light detected by the optical detector 915 is a value corresponding to the transmittance of the etalon 916, and the value varies depending on wavelength. Therefore, it is possible to perform feedback based on this ratio so that the wavelength of the first laser beam emitted from the first tunable laser 911 becomes a desired wavelength λ1.

The second laser source 920 includes a second tunable laser 921 and a second wavelength locker 922. Part of a second laser beam emitted from the second tunable laser 921 is reflected from a partially reflecting mirror 923 to enter the second wavelength locker 922. The second wavelength locker 922 includes a partially reflecting mirror 924 that splits the second laser beam that has entered the second wavelength locker 922. Of the second laser beam that has entered the second wavelength locker 922, a laser beam transmitted through the partially reflecting mirror 924 enters an optical detector 925, and a laser beam reflected from the partially reflecting mirror 924 enters an optical detector 927 through an etalon 926. Only the laser beam transmitted through the etalon 926 is detected in the optical detector 927. The ratio of the amount of light detected by the optical detector 927 and the amount of light detected by the optical detector 925 is a value corresponding to the transmittance of the etalon 926, and the value varies depending on wavelength. Therefore, it is possible to perform feedback based on this ratio so that the wavelength of the second laser beam emitted from the second tunable laser 921 becomes a desired wavelength λ2.

The third laser source 930 includes a third tunable laser 931 and a third wavelength locker 932. Part of a third laser beam emitted from the third tunable laser 931 is reflected from a partially reflecting mirror 933 to enter the third wavelength locker 932. The third wavelength locker 932 includes a partially reflecting mirror 934 that splits the third laser beam that has entered the third wavelength locker 932. Of the third laser beam that has entered the third wavelength locker 932, a laser beam transmitted through the partially reflecting mirror 934 enters an optical detector 935, and a laser beam reflected from the partially reflecting mirror 934 enters an optical detector 937 through an etalon 936. Only the laser beam transmitted through the etalon 936 is detected in the optical detector 937. The ratio of the amount of light detected by the optical detector 937 and the amount of light detected by the optical detector 935 is a value corresponding to the transmittance of the etalon 936, and the value varies depending on wavelength. Therefore, it is possible to perform feedback based on this ratio so that the wavelength of the third laser beam emitted from the third tunable laser 931 becomes a desired wavelength λ3.

The fourth laser source 940 includes a fourth tunable laser 941 and a fourth wavelength locker 942. Part of a fourth laser beam emitted from the fourth tunable laser 941 is reflected from a partially reflecting mirror 943 to enter the fourth wavelength locker 942. The fourth wavelength locker 942 includes a partially reflecting mirror 944 that splits the fourth laser beam that has entered the fourth wavelength locker 942. Of the fourth laser beam that has entered the fourth wavelength locker 942, a laser beam transmitted through the partially reflecting mirror 944 enters an optical detector 945, and a laser beam reflected from the partially reflecting mirror 944 enters an optical detector 947 through an etalon 946. Only the laser beam transmitted through the etalon 946 is detected in the optical detector 947. The ratio of the amount of light detected by the optical detector 947 and the amount of light detected by the optical detector 945 is a value corresponding to the transmittance of the etalon 946, and the value varies depending on wavelength. Therefore, it is possible to perform feedback based on this ratio so that the wavelength of the fourth laser beam emitted from the fourth tunable laser 941 becomes a desired wavelength λ4.

Each of the first laser beam of the wavelength λ1 transmitted through the partially reflecting mirror 913, the second laser beam of the wavelength λ2 transmitted through the partially reflecting mirror 923, the third laser beam of the wavelength λ3 transmitted through the partially reflecting mirror 933, and the fourth laser beam of the wavelength λ4 transmitted through the partially reflecting mirror 943 is used as signal light of optical communications.

Therefore, according to the laser depicted in FIG. 2, it is possible to control the first laser source 910, the second laser source 920, the third laser source 930, and the fourth laser source 940 independent of one another.

In general, an oscillation spectrum in the case of modulating a laser beam spreads over at least a wavelength range that matches a modulation baud rate because of the influence of sidebands due to a modulation operation. For example, in the case of performing modulation at 25 Gbaud, the oscillation spectrum spreads over a range of 25 GHz (approximately 0.2 nm). When the oscillation wavelengths of first, second, third, and fourth lasers are arranged at equal intervals of 25 GHz without an error, it is possible to transmit signals with the first through fourth lasers without crosstalk because the oscillation spectra spread at the same intervals as the oscillation wavelengths of the first through fourth lasers and do not overlap with each other. In the case where the first through fourth lasers have independent wavelength control mechanisms as described above, however, a wavelength error occurs at random in each laser (FIG. 3). For example, if there is a wavelength setting error such that the wavelength of a first laser beam shifts to the long-wave side and the wavelength of a second laser beam shifts to the short-wave side, the wavelength range of the first laser beam and the wavelength range of the second laser beam overlap with each other to cause crosstalk between the first laser beam and the second laser beam. Likewise, if the wavelength of the second laser beam and the wavelength of a third laser beam come close to each other because of a wavelength error, the wavelength range of the second laser beam and the wavelength range of the third laser beam overlap with each other to cause crosstalk. Furthermore, if the wavelength of the third laser beam and the wavelength of a fourth laser beam come close to each other because of a wavelength error, the wavelength range of the third laser beam and the wavelength range of the fourth laser beam overlap with each other to cause crosstalk.

Thus, when the wavelength spacing of adjacent wavelengths becomes less than a modulation baud rate because of a wavelength error, optical signals are crossed to prevent normal transmission. Therefore, it is desirable to ensure a wavelength spacing that is at least equal to a modulation baud rate or more in view of a wavelength error. Therefore, it is desirable to provide a wavelength spacing with a margin commensurate with a wavelength error, namely, approximately a few GHz, and thus, there is a limit to reduction of a wavelength spacing. As a result, wavelength division multiplexing communications systems have been prevented from sufficiently increasing transmission capacity.

According to a laser of an embodiment, it is possible to reduce the wavelength spacing between emitted laser beams of different wavelengths. Therefore, it is possible to increase transmission capacity in wavelength division multiplexing communications systems.

Preferred embodiments of the present invention will be explained with reference to accompanying drawings. The same member or element is referred to using the same reference numeral, and a repetitive description thereof is omitted.

[a] First Embodiment

A laser according to a first embodiment is described. The laser according to this embodiment is configured to emit four laser beams of wavelengths different from one another from a single chip.

Figure 4:
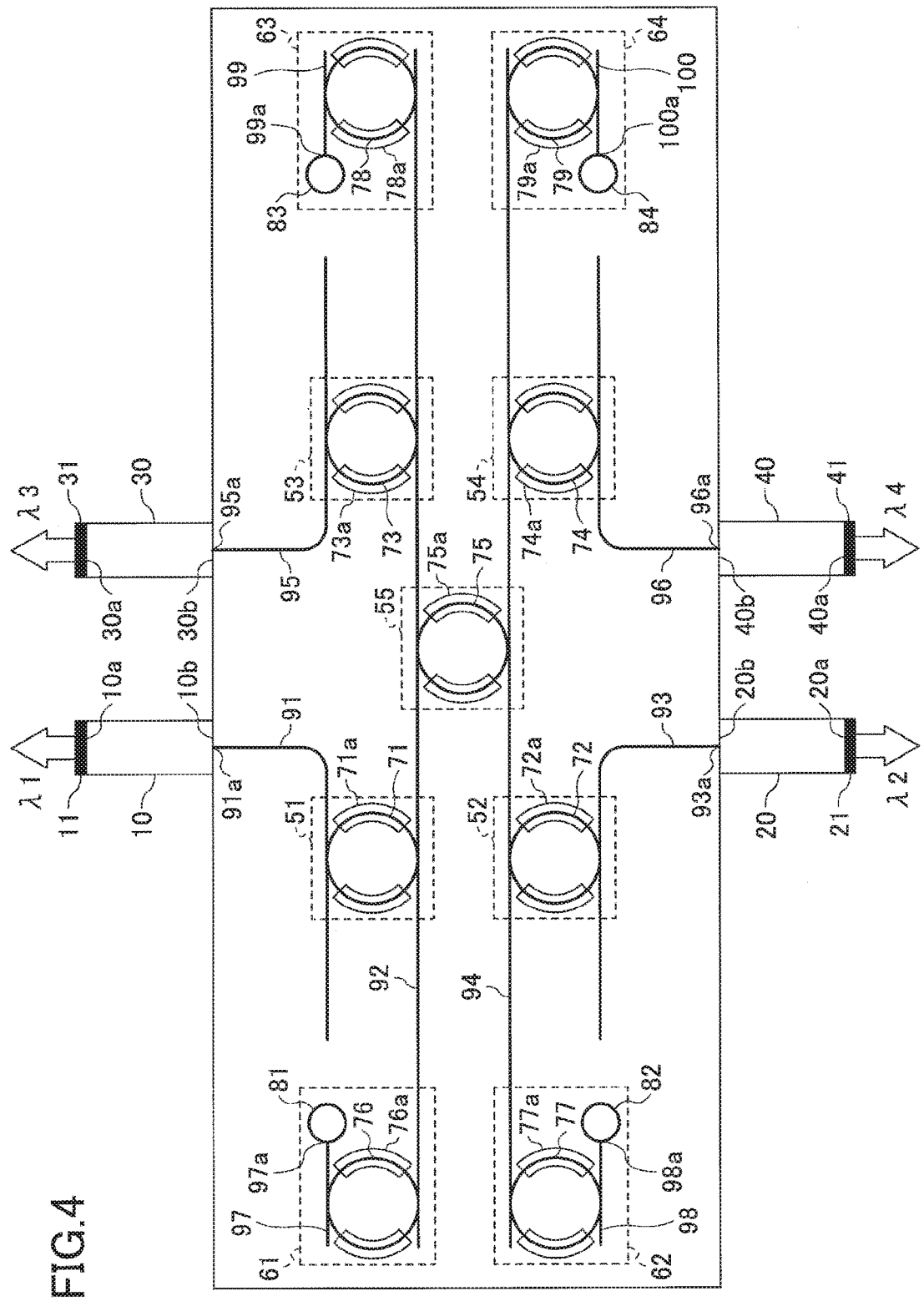
FIG. 4 is a diagram depicting a structure of a laser according to a first embodiment.

Referring to FIG. 4, the laser includes a first semiconductor optical amplifier (SOA) 10, a second SOA 20, a third SOA 30, a fourth SOA 40, a first wavelength selective filter 51, a second wavelength selective filter 52, a third wavelength selective filter 53, a fourth wavelength selective filter 54, a fifth wavelength selective filter 55, a first wavelength selective mirror 61, a second wavelength selective mirror 62, a third wavelength selective mirror 63, and a fourth wavelength selective mirror 64. According to embodiments of the present invention, the first SOA 10 may be a first gain medium, the second SOA 20 may be a second gain medium, the third SOA 30 may be a third gain medium, and the fourth SOA 40 may be a fourth gain medium.

According to the laser, a first laser beam is emitted from a first end face 10$a$ of the first SOA 10, and a second laser beam is emitted from a first end face 20$a$ of the second SOA 20. A partially reflecting mirror 11 is formed of a cleavage plane or a partially reflective coating at or on the first end face 10$a$ of the first SOA 10, and a partially reflecting mirror 21 is formed of a cleavage plane or a partially reflective coating at or on the first end face 20$a$ of the second SOA 20.

Furthermore, a third laser beam is emitted from a first end face 30$a$ of the third SOA 30, and a fourth laser beam is emitted from a first end face 40$a$ of the fourth SOA 40. A partially reflecting mirror 31 is formed of a cleavage plane or a partially reflective coating at or on the first end face 30$a$ of the third SOA 30, and a partially reflecting mirror 41 is formed of a cleavage plane or a partially reflective coating at or on the first end face 40$a$ of the fourth SOA 40.

The first wavelength selective filter 51 includes a first ring resonator 71, and part of a first optical waveguide 91 and part of a second optical waveguide 92 that are close to the first ring resonator 71. The first ring resonator 71 is formed between the first optical waveguide 91 and the second optical waveguide 92.

The second wavelength selective filter 52 includes a second ring resonator 72, and part of a third optical waveguide 93 and part of a fourth optical waveguide 94 that are close to the second ring resonator 72. The second ring resonator 72 is formed between the third optical waveguide 93 and the fourth optical waveguide 94.

The third wavelength selective filter 53 includes a third ring resonator 73, and part of a fifth optical waveguide 95 and part of the second optical waveguide 92 that are close to the third ring resonator 73. The third ring resonator 73 is formed between the fifth optical waveguide 95 and the second optical waveguide 92.

The fourth wavelength selective filter 54 includes a fourth ring resonator 74, and part of a sixth optical waveguide 96 and part of the fourth optical waveguide 94 that are close to the fourth ring resonator 74. The fourth ring resonator 74 is formed between the sixth optical waveguide 96 and the fourth optical waveguide 94.

The fifth wavelength selective filter 55 includes a fifth ring resonator 75, and part of the second optical waveguide 92 and part of the fourth optical waveguide 94 that are close to the fifth ring resonator 75. The fifth ring resonator 75 is formed between the second optical waveguide 92 and the fourth optical waveguide 94.

The first wavelength selective mirror 61 includes a sixth ring resonator 76, part of the second optical waveguide 92 that is close to the sixth ring resonator 76, a seventh optical waveguide 97, and a first loop mirror 81 provided at an end 97a of the seventh optical waveguide 97. The sixth ring resonator 76 is formed between the second optical waveguide 92 and the seventh optical waveguide 97.

The second wavelength selective mirror 62 includes a seventh ring resonator 77, part of the fourth optical waveguide 94 that is close to the seventh ring resonator 77, an eighth optical waveguide 98, and a second loop mirror 82 provided at an end 98a of the eighth optical waveguide 98. The seventh ring resonator 77 is formed between the fourth optical waveguide 94 and the eighth optical waveguide 98.

The third wavelength selective mirror 63 includes an eighth ring resonator 78, part of the second optical waveguide 92 that is close to the eighth ring resonator 78, a ninth optical waveguide 99, and a third loop mirror 83 provided at an end 99a of the ninth optical waveguide 99. The eighth ring resonator 78 is formed between the second optical waveguide 92 and the ninth optical waveguide 99.

The fourth wavelength selective mirror 64 includes a ninth ring resonator 79, part of the fourth optical waveguide 94 that is close to the ninth ring resonator 79, a tenth optical waveguide 100, and a fourth loop mirror 84 provided at an end 100a of the tenth optical waveguide 100. The ninth ring resonator 79 is formed between the fourth optical waveguide 94 and the tenth optical waveguide 100.

Heater electrodes 71a are formed on a ring part of the first ring resonator 71, heater electrodes 72a are formed on a ring part of the second ring resonator 72, and heater electrodes 73a are formed on a ring part of the third ring resonator 73. Furthermore, heater electrodes 74a are formed on a ring part of the fourth ring resonator 74, heater electrodes 75a are formed on a ring part of the fifth ring resonator 75, and heater electrodes 76a are formed on a ring part of the sixth ring resonator 76. Furthermore, heater electrodes 77a are formed on a ring part of the seventh ring resonator 77, heater electrodes 78a are formed on a ring part of the eighth ring resonator 78, and heater electrodes 79a are formed on a ring part of the ninth ring resonator 79. According to this embodiment, it is possible to finely adjust the resonant wavelengths of the first through ninth ring resonators 71 through 79 by causing an electric current to flow through the heater electrodes 71a through 79a to heat the first through ninth ring resonators 71 through 79, respectively.

The first SOA 10 is installed to allow light to exit from either one to enter the other of a second end face 10b of the first SOA 10 and an end 91a of the first optical waveguide 91. Preferably, a spot-size converter (not depicted) is formed at the end 91a of the first optical waveguide 91 to increase the efficiency of optical coupling to the first SOA 10.

The second SOA 20 is installed to allow light to exit from either one to enter the other of a second end face 20b of the second SOA 20 and an end 93a of the third optical waveguide 93. Preferably, a spot-size converter (not depicted) is formed at the end 93a of the third optical waveguide 93 to increase the efficiency of optical coupling to the second SOA 20.

The third SOA 30 is installed to allow light to exit from either one to enter the other of a second end face 30b of the third SOA 30 and an end 95a of the fifth optical waveguide 95. Preferably, a spot-size converter (not depicted) is formed at the end 95a of the fifth optical waveguide 95 to increase the efficiency of optical coupling to the third SOA 30.

The fourth SOA 40 is installed to allow light to exit from either one to enter the other of a second end face 40b of the fourth SOA 40 and an end 96a of the sixth optical waveguide 96. Preferably, a spot-size converter (not depicted) is formed at the end 96a of the sixth optical waveguide 96 to increase the efficiency of optical coupling to the fourth SOA 40.

According to this embodiment, ring resonators, optical waveguides, and loop mirrors are formed of silicon waveguides formed on a silicon substrate. Specifically, the first through ninth ring resonators 71 through 79, the first through tenth optical waveguides 91 through 100, and the first through fourth loop mirrors 81 through 84 are formed of silicon waveguides formed on a silicon substrate.

Figure 5A:
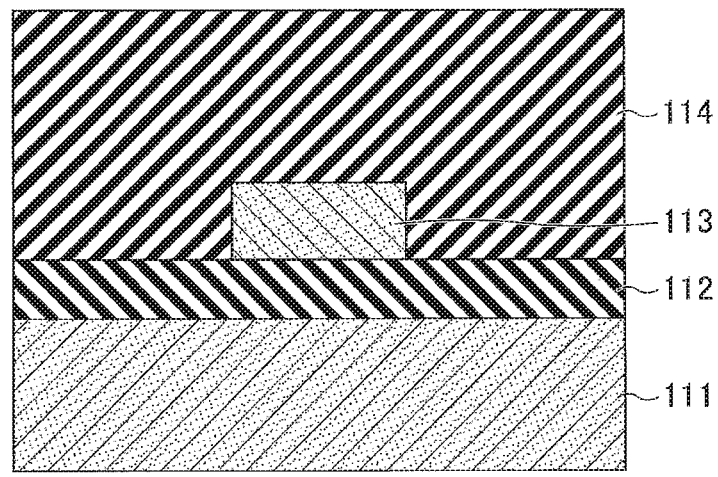
FIGS. 5A and 5B are diagrams depicting a cross section of the laser according to the first embodiment.

Referring to FIG. 5A, the silicon waveguides are formed of a lower cladding layer 112 formed on a silicon substrate 111, a core layer formed on the lower cladding layer 112, and an upper cladding layer 114 formed to cover the core layer 113. The lower cladding layer 112 is formed of $SiO_2$, the upper cladding layer 114 is formed of $SiO_2$, SiN, SiON or the like, and the core layer 113 is formed of silicon to be 0.5 μm in width and 0.2 μm in height. Light propagates through the core layer 113. According to this embodiment, the silicon waveguides are formed by processing a silicon on insulator (SOI) substrate.

Figure 5B:
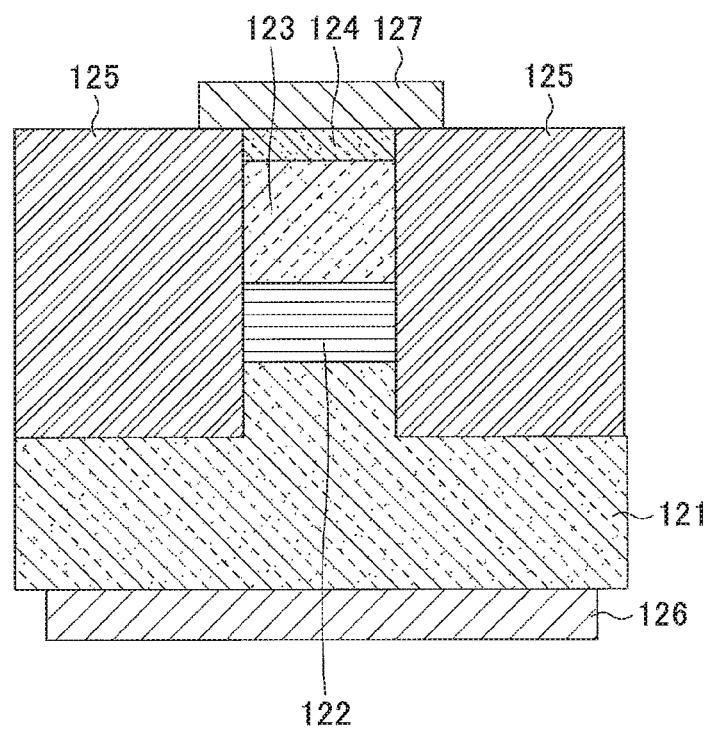

Referring to FIG. 5B, each of the first SOA 10, the second SOA 20, the third SOA 30, and the fourth SOA 40 includes a lower cladding layer 121 formed of n-InP, an active layer 122 formed on the lower cladding layer 121, an upper cladding layer 123 formed of p-InP on the active layer 122, and a p contact layer 124 formed of p-InGaAsP/InGaAs, which are stacked in layers in order. Part of the p contact layer 124, the upper cladding layer 123, the active layer 122, and the lower cladding layer 121 is removed to form a striped mesa shape. A buried layer 125 is formed of semi-insulating InP where the part is removed. An n electrode 126 is formed on the bottom surface of the lower cladding layer 121, and a p electrode 127 is formed on the p contact layer 124.

Figure 6A:
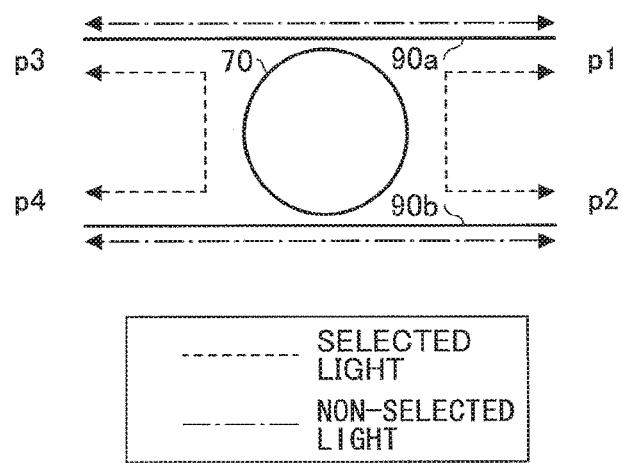
FIGS. 6A through 6C are diagrams illustrating a wavelength selective filter according to the first embodiment.

Next, a wavelength selective filter using a ring resonator employed in the laser according to this embodiment is described with reference to FIGS. 6A through 6C. According to this embodiment, a wavelength selective filter includes a ring resonator 70 and two optical waveguides 90a and 90b provided close to the ring resonator 70 as depicted in FIG. 6A. For convenience of description, a first end and a second end of the optical waveguide 90a are referred to as "port p1" and "port p3," respectively, and a first end and a second end of the optical waveguide 90b are referred to as "port p2" and "port p4," respectively, in the following description of the wavelength selective filter. The ports p1 through p4 may be referred to as input/output ports.

Of light entering the port p1 of the optical waveguide 90a, light of the resonant wavelengths of the ring resonator 70 propagates to the ring resonator 70 and further to the optical waveguide 90b through the ring resonator 70 to exit from the port p2. Light other than the light of the resonant wavelengths of the ring resonator 70 directly propagates through the optical waveguide 90a to exit from the port p3.

Likewise, of light entering the port p3 of the optical waveguide 90a, light of the resonant wavelengths of the ring resonator 70 propagates to the ring resonator 70 and further to the optical waveguide 90b through the ring resonator 70 to exit from the port p4. Light other than the light of the resonant wavelengths of the ring resonator 70 directly propagates through the optical waveguide 90a to exit from the port p1.

Furthermore, of light entering the port p2 of the optical waveguide 90b, light of the resonant wavelengths of the ring resonator 70 propagates to the ring resonator 70 and further to the optical waveguide 90a through the ring resonator 70 to exit from the port p1. Light other than the light of the resonant wavelengths of the ring resonator 70 directly propagates through the optical waveguide 90b to exit from the port p4.

Furthermore, of light entering the port p4 of the optical waveguide 90b, light of the resonant wavelengths of the ring resonator 70 propagates to the ring resonator 70 and further to the optical waveguide 90a through the ring resonator 70 to exit from the port p3. Light other than the light of the resonant wavelengths of the ring resonator 70 directly propagates through the optical waveguide 90b to exit from the port p2. According to the ring resonator 70, whichever port light enters, a resonant wavelength that propagates to the ring resonator 70 is the same.

In FIG. 6A, light of a resonant wavelength that propagates from one to the other of the optical waveguide 90a and the optical waveguide 90b through the ring resonator 70 is indicated by a dashed line as selected light. Furthermore, light other than the light of a resonant wavelength that propagates through the optical waveguide 90a or 90b without propagating to the ring resonator 70 is indicated by a one-dot chain line as non-selected light. According to this embodiment, light that propagates from one to the other of the optical waveguide 90a and the optical waveguide 90b through the ring resonator 70 may be referred to as "drop light," and light that propagates through the optical waveguide 90a or 90b without propagating to the ring resonator 70 may be referred to as "through light."

Figure 6B:
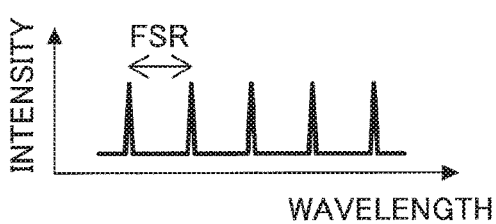
Figure 6C:
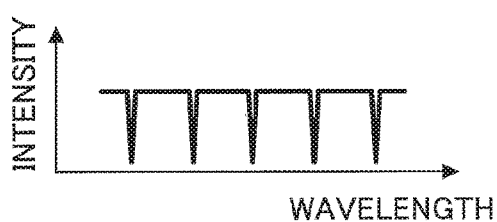

A spectrum of the drop light that is the selected light of the wavelength selective filter depicted in FIG. 6A is presented in FIG. 6B, and a spectrum of the through light that is the non-selected light of the wavelength selective filter depicted in FIG. 6A is presented in FIG. 6C. As exhibited in FIG. 6B, this wavelength selective filter can select only light of resonant wavelengths that periodically appear, and propagate the light from one to the other of the optical waveguide 90a and the optical waveguide 90b. As a result, it is possible to select resonant wavelength light of a predetermined wavelength as selected light. According to this embodiment, this resonant wavelength interval may be referred to as "free spectral range (FSR)."

According to the laser of this embodiment, the first wavelength selective filter 51, the second wavelength selective filter 52, the third wavelength selective filter 53, the fourth wavelength selective filter 54, and the fifth wavelength selective filter 55 have the same structure as the wavelength selective filter depicted in FIG. 6A. Furthermore, the first wavelength selective mirror 61, the second wavelength selective mirror 62, the third wavelength selective mirror 63, and the fourth wavelength selective mirror 64 include the wavelength selective filter depicted in FIG. 6A, and a loop mirror is provided at an end of the optical waveguide 90b and light enters the wavelength selective filter from one end of the optical waveguide 90a.

Figure 7:
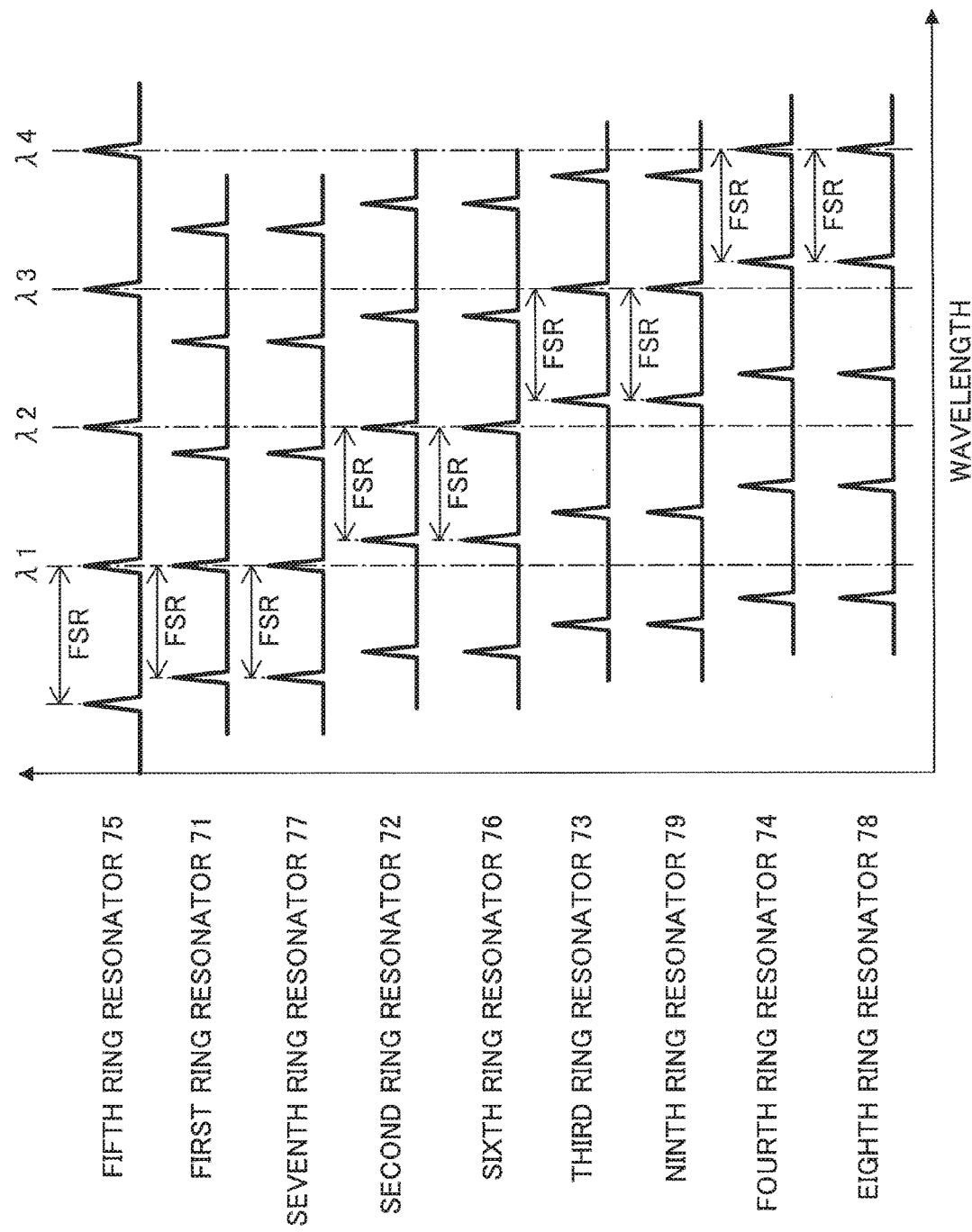
FIG. 7 is a diagram illustrating resonant wavelengths of the laser according to the first embodiment.

Next, an operation of the laser according to this embodiment is described. According to this embodiment, as depicted in FIG. 7, the FSR of the fifth ring resonator 75 and the FSR of the first ring resonator 71 and the seventh ring resonator 77 are slightly different. Specifically, the fifth ring resonator 75 is formed with a radius of approximately 475 μm to have an FSR of 25 GHz, and the first ring resonator 71 and the seventh ring resonator 77 are formed to have an FSR narrower than the FSR of the fifth ring resonator 75 by approximately 5%. Accordingly, the first ring resonator 71 and the seventh ring resonator 77 are formed with a radius of approximately 500 μm to have an FSR of 23.75 GHz. When the FSR of the fifth ring resonator 75 and the FSR of the first ring resonator 71 and the seventh ring resonator 77 are thus slightly different, laser oscillation occurs at the wavelength λ1, at which a resonant wavelength in the fifth ring resonator 75 matches a resonant wavelength in the first ring resonator 71 and the seventh ring resonator 77 (the Vernier effect). According to this embodiment, a laser beam of this wavelength λ1 serves as the first laser beam. According to this embodiment, the first ring resonator 71 and the seventh ring resonator 77 are formed with substantially the same radius to have the same resonant wavelengths.

Figure 8:
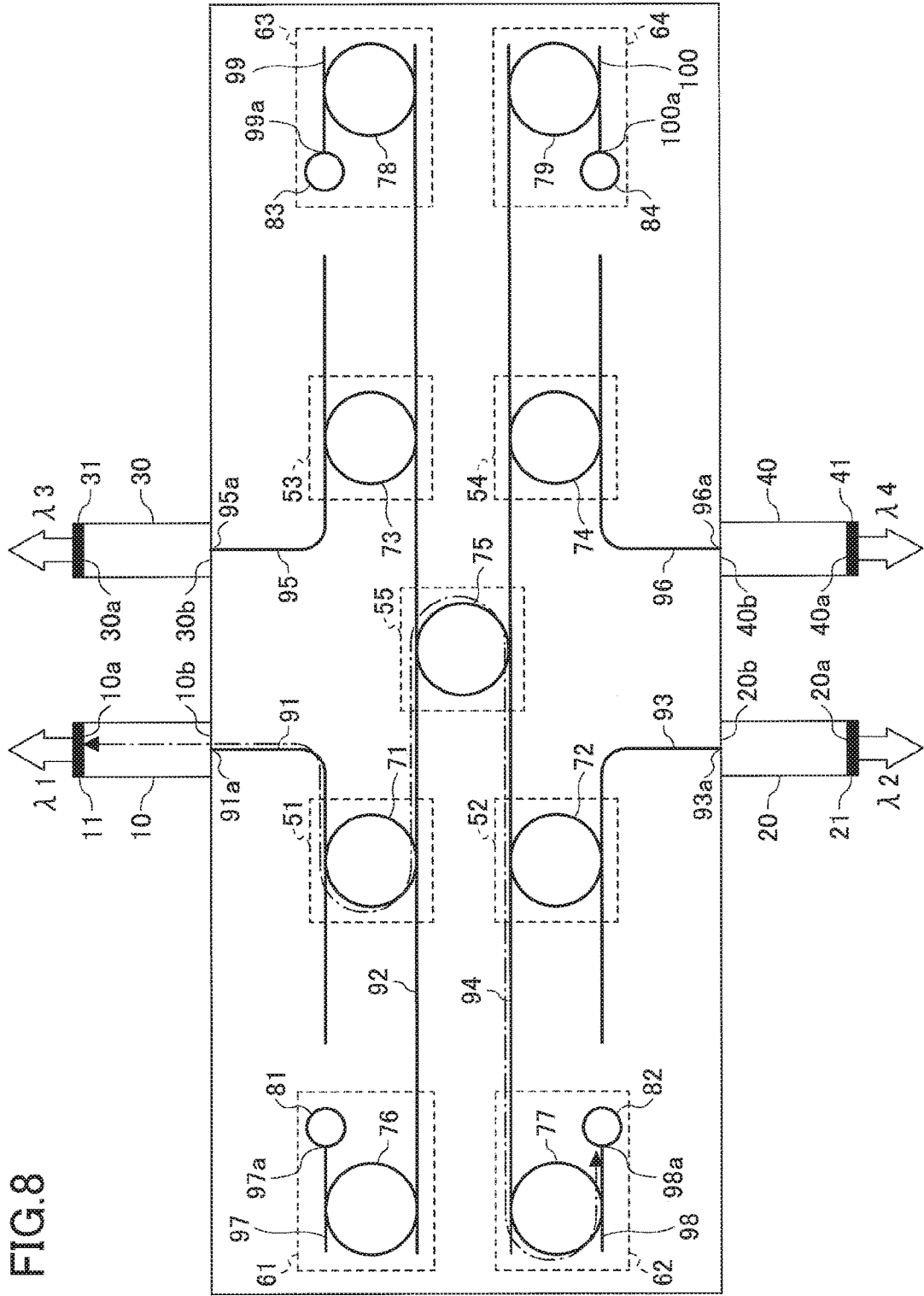
FIG. 8 is a diagram illustrating an optical path of the laser according to the first embodiment.

That is, as depicted in FIG. 8, a first laser resonator (cavity) that emits the first laser beam of the wavelength λ1 through the optical path indicated by the one-dot chain line is formed between the partially reflecting mirror 11 formed on the first end face 10a of the first SOA 10 and the second wavelength selective mirror 62. Specifically, light of the wavelength λ1 is light of a wavelength that is drop light in the fifth wavelength selective filter 55 and the first wavelength selective filter 51. Accordingly, laser oscillation occurs in an optical path that is routed through the first SOA 10, the first optical waveguide 91, the first ring resonator 71, the second optical waveguide 92, the fifth ring resonator 75, and the fourth optical waveguide 94 between the partially reflecting mirror 11 and the second wavelength selective mirror 62. To be more specific, laser oscillation occurs in an optical path that is routed through the first SOA 10, the first optical waveguide 91, the first ring resonator 71, the second optical waveguide 92, the fifth ring resonator 75, the fourth optical waveguide 94, the seventh ring resonator 77, and the eighth optical waveguide 98 between the partially reflecting mirror 11 and the second loop mirror 82.

As described above, according to a filter formed of two ring resonators that are minutely different in resonant wavelength interval from each other, letting the resonant wavelength interval of the first ring resonator 71 be FSRa and letting the resonant wavelength interval of the fifth ring resonator 75 be FSRb, the tunable wavelength range is expressed by below-described Eq. (1):

$$(\text{Tunable wavelength range}) = \text{FSRb} \times \{\text{FSRa}/(|\text{FSRa} - \text{FSRb}|)\}, \quad (1)$$

where {FSRa/(|FSRa−FSRb|)} is a wavelength tuning enhancement factor in the case of using the Vernier effect, and the oscillation wavelength tuning range of a laser beam can be increased by the wavelength tuning enhancement factor with respect to a change of a resonant wavelength in a single ring resonator. In Eq. (1), {FSRa/(|FSRa−FSRb1|)} is the result of the division of the resonant wavelength interval of the first ring resonator 71 by the difference between the resonant wavelength interval of the first ring resonator 71 and the resonant wavelength interval of the fifth ring resonator 75. As this difference diminishes, the wavelength tunable range increases. For example, when the difference between the resonant wavelength interval of the first ring resonator 71 and the resonant wavelength interval of the fifth ring resonator 75 is 10% of the resonant wavelength interval of the first ring resonator 71, the wavelength tunable range can be decupled. The wavelength tuning enhancement factor is at least five or more, and preferably, ten or more, to make effective use of an increase in the wavelength tuning range due to the Vernier effect. Therefore, the difference between the resonant wavelength interval of the first ring resonator 71 and the resonant wavelength interval of the fifth ring resonator 75 is preferably small relative to the resonant wavelength interval of the first ring resonator 71, for example, 20% or less, more preferably, 10% or less, of the resonant wavelength interval of the first ring resonator 71. As described below, however, if the difference between resonant wavelength intervals is too small, the independent operations of the four laser resonators may be adversely affected to require the adjustment of the resonant wavelength intervals as well as the finesse of the ring resonators.

Furthermore, according to this embodiment, as depicted in FIG. 7, the FSR of the fifth ring resonator 75 and the FSR of the second ring resonator 72 and the sixth ring resonator 76 are slightly different. That is, the second ring resonator 72 and the sixth ring resonator 76 are formed with a radius of approximately 500 μm to have an FSR narrower than the FSR of the fifth ring resonator 75 by approximately 5%, namely, an FSR of 23.75 GHz. When the FSR of the fifth ring resonator 75 and the FSR of the second ring resonator 72 and the sixth ring resonator 76 are thus slightly different, laser oscillation occurs at the wavelength $\lambda 2$, at which a resonant wavelength in the fifth ring resonator 75 matches a resonant wavelength in the second ring resonator 72 and the sixth ring resonator 76 (the Vernier effect). According to this embodiment, a laser beam of this wavelength $\lambda 2$ serves as the second laser beam. According to this embodiment, the second ring resonator 72 and the sixth ring resonator 76 are formed with substantially the same radius to have the same resonant wavelengths.

Figure 9:
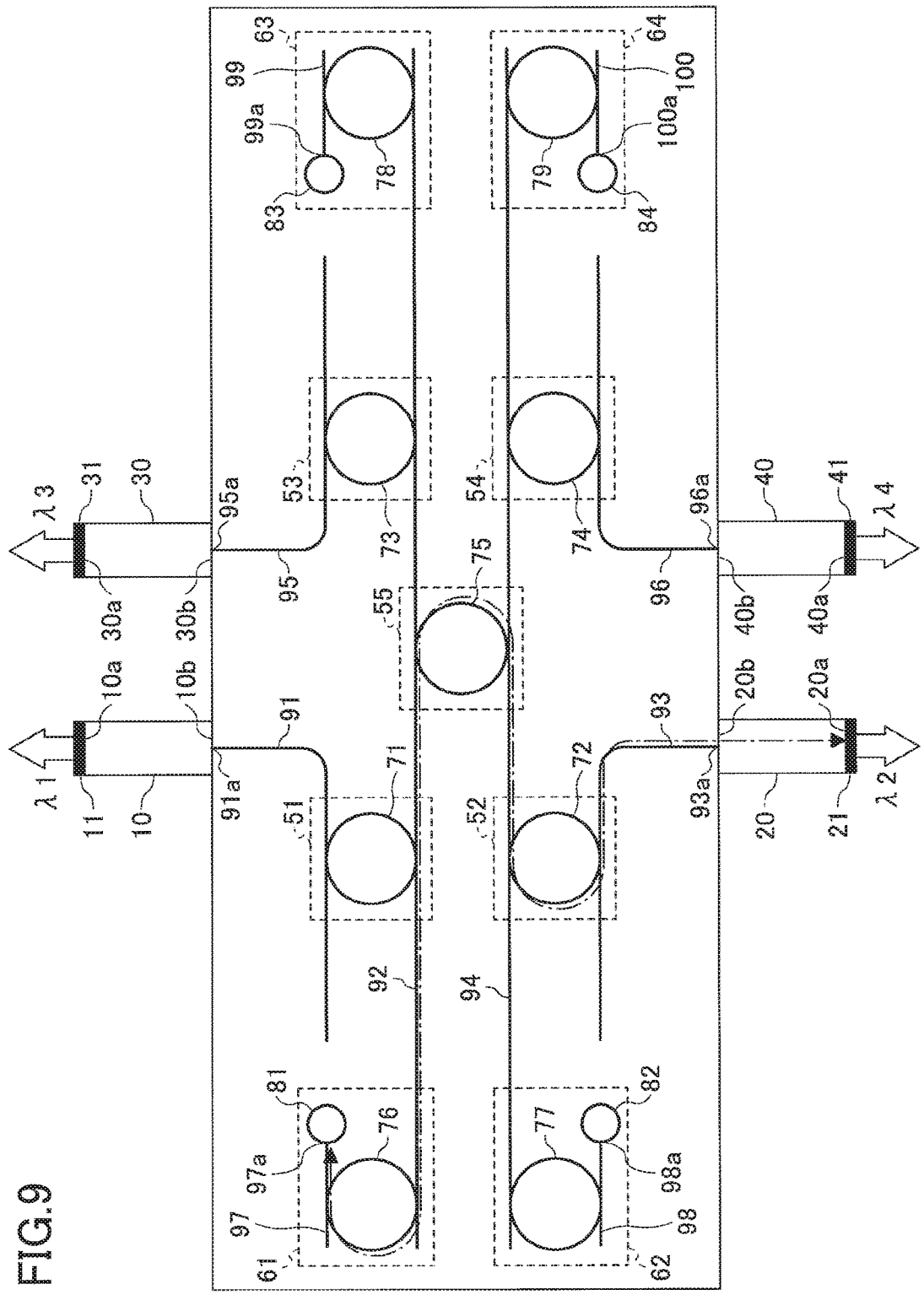
FIG. 9 is a diagram illustrating an optical path of the laser according to the first embodiment.

That is, as depicted in FIG. 9, a second laser resonator (cavity) that emits the second laser beam of the wavelength $\lambda 2$ through the optical path indicated by the one-dot chain line is formed between the partially reflecting mirror 21 formed on the first end face 20a of the second SOA 20 and the first wavelength selective mirror 61. Specifically, light of the wavelength $\lambda 2$ is light of a wavelength that is drop light in the fifth wavelength selective filter 55 and the second wavelength selective filter 52. Accordingly, laser oscillation occurs in an optical path that is routed through the second SOA 20, the third optical waveguide 93, the second ring resonator 72, the fourth optical waveguide 94, the fifth ring resonator 75, and the second optical waveguide 92 between the partially reflecting mirror 21 and the first wavelength selective mirror 61. To be more specific, laser oscillation occurs in an optical path that is routed through the second SOA 20, the third optical waveguide 93, the second ring resonator 72, the fourth optical waveguide 94, the fifth ring resonator 75, the second optical waveguide 92, the sixth ring resonator 76, and the seventh optical waveguide 97 between the partially reflecting mirror 21 and the first loop mirror 81.

Furthermore, according to this embodiment, as depicted in FIG. 7, the FSR of the fifth ring resonator 75 and the FSR of the third ring resonator 73 and the ninth ring resonator 79 are slightly different. That is, the third ring resonator 73 and the ninth ring resonator 79 are formed with a radius of approximately 500 μm to have an FSR narrower than the FSR of the fifth ring resonator 75 by approximately 5%, namely, an FSR of 23.75 GHz. When the FSR of the fifth ring resonator 75 and the FSR of the third ring resonator 73 and the ninth ring resonator 79 are thus slightly different, laser oscillation occurs at the wavelength $\lambda 3$, at which a resonant wavelength in the fifth ring resonator 75 matches a resonant wavelength in the third ring resonator 73 and the ninth ring resonator 79 (the Vernier effect). According to this embodiment, a laser beam of this wavelength $\lambda 3$ serves as the third laser beam. According to this embodiment, the third ring resonator 73 and the ninth ring resonator 79 are formed with substantially the same radius to have the same resonant wavelengths.

Figure 10:
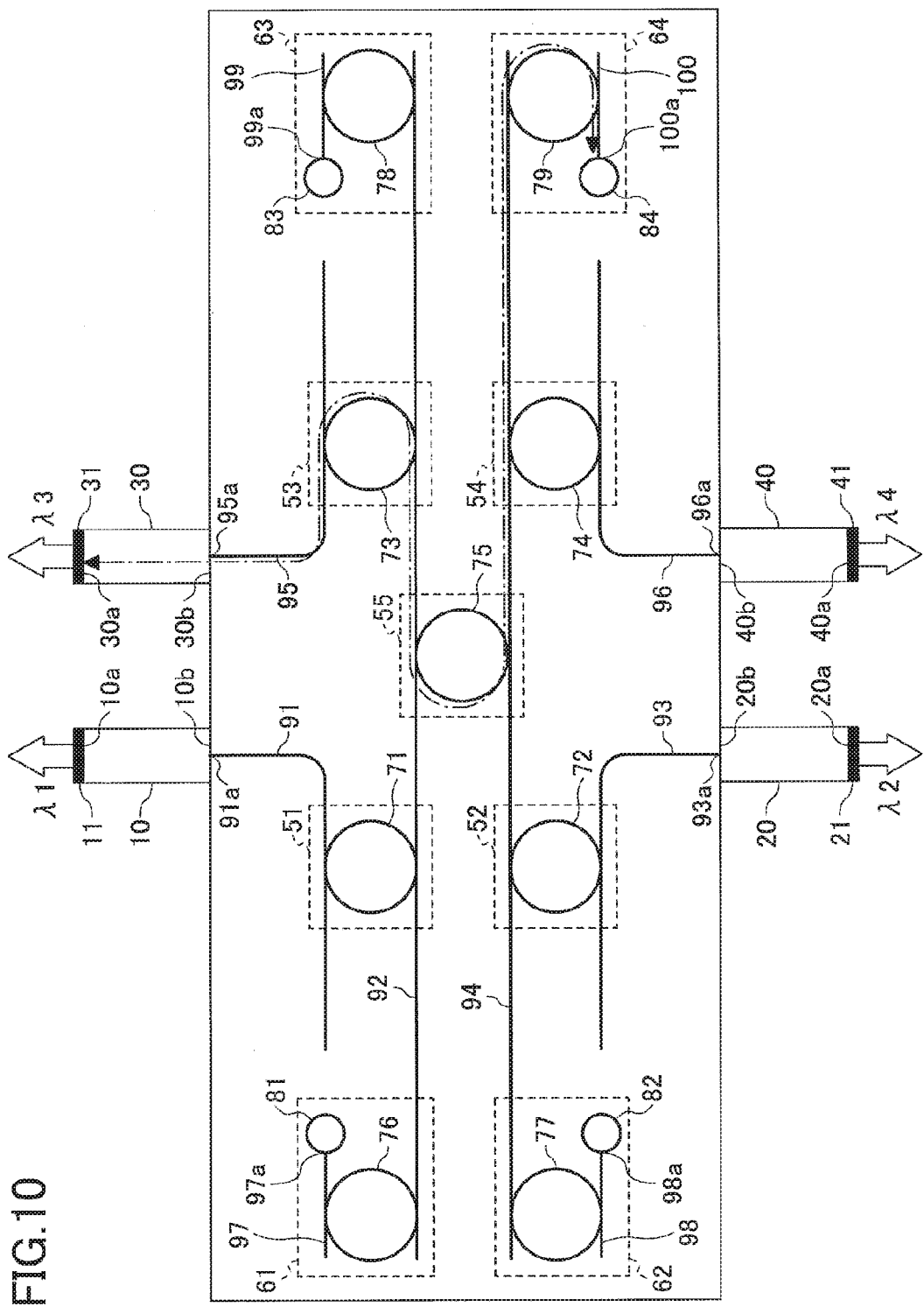
FIG. 10 is a diagram illustrating an optical path of the laser according to the first embodiment.

That is, as depicted in FIG. 10, a third laser resonator (cavity) that emits the third laser beam of the wavelength $\lambda 3$ through the optical path indicated by the one-dot chain line is formed between the partially reflecting mirror 31 formed on the first end face 30a of the third SOA 30 and the fourth wavelength selective mirror 64. Specifically, light of the wavelength $\lambda 3$ is light of a wavelength that is drop light in the fifth wavelength selective filter 55 and the third wavelength selective filter 53. Accordingly, laser oscillation occurs in an optical path that is routed through the third SOA 30, the fifth optical waveguide 95, the third ring resonator 73, the second optical waveguide 92, the fifth ring resonator 75, and the fourth optical waveguide 94 between the partially reflecting mirror 31 and the fourth wavelength selective mirror 64. To be more specific, laser oscillation occurs in an optical path that is routed through the third SOA 30, the fifth optical waveguide 95, the third ring resonator 73, the second optical waveguide 92, the fifth ring resonator 75, the fourth optical waveguide 94, the ninth ring resonator 79, and the tenth optical waveguide 100 between the partially reflecting mirror 31 and the fourth loop mirror 84.

Furthermore, according to this embodiment, as depicted in FIG. 7, the FSR of the fifth ring resonator 75 and the FSR of the fourth ring resonator 74 and the eighth ring resonator 78 are slightly different. That is, the fourth ring resonator 74 and the eighth ring resonator 78 are formed with a radius of approximately 500 μm to have an FSR narrower than the FSR of the fifth ring resonator 75 by approximately 5%, namely, an FSR of 23.75 GHz. When the FSR of the fifth ring resonator 75 and the FSR of the fourth ring resonator 74 and the eighth ring resonator 78 are thus slightly different, laser oscillation occurs at the wavelength $\lambda 4$, at which a resonant wavelength in the fifth ring resonator 75 matches a resonant wavelength in the fourth ring resonator 74 and the eighth ring resonator 78 (the Vernier effect). According to this embodiment, a laser beam of this wavelength $\lambda 3$ serves as the third laser beam. According to this embodiment, the fourth ring resonator 74 and the eighth ring resonator 78 are formed with substantially the same radius to have the same resonant wavelengths.

Figure 11:
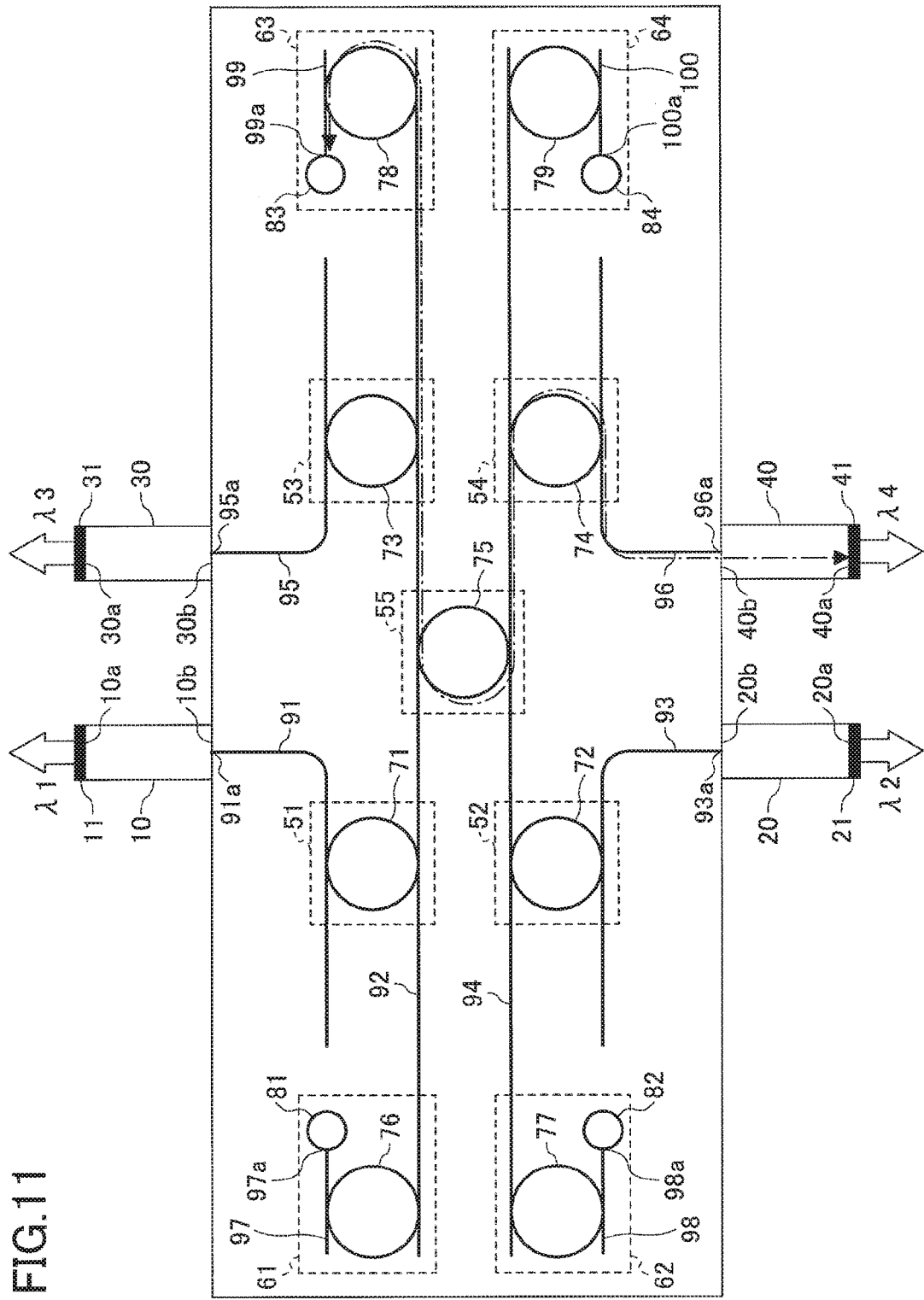
FIG. 11 is a diagram illustrating an optical path of the laser according to the first embodiment.

That is, as depicted in FIG. 11, a fourth laser resonator (cavity) that emits the fourth laser beam of the wavelength $\lambda 4$ through the optical path indicated by the one-dot chain line is formed between the partially reflecting mirror 41 formed on the first end face 40a of the fourth SOA 40 and the third wavelength selective mirror 63. Specifically, light of the wavelength $\lambda 4$ is light of a wavelength that is drop light in the fifth wavelength selective filter 55 and the fourth wavelength selective filter 54. Accordingly, laser oscillation occurs in an optical path that is routed through the fourth SOA 40, the sixth optical waveguide 96, the fourth ring resonator 74, the fourth optical waveguide 94, the fifth ring resonator 75, and the second optical waveguide 92 between the partially reflecting mirror 41 and the third wavelength selective mirror 63. To be more specific, laser oscillation occurs in an optical path that is routed through the fourth SOA 40, the sixth optical waveguide 96, the fourth ring resonator 74, the fourth optical waveguide 94, the fifth ring resonator 75, the second optical waveguide 92, the eighth ring resonator 78, and the ninth optical waveguide 99 between the partially reflecting mirror 41 and the third loop mirror 83.

According to this embodiment, the wavelengths λ1, λ2, λ3, and λ4 are adjusted to be different from one another by positions at which the ring resonators are formed and by the heaters.

FIG. 12 represents the relationship between resonant wavelengths in ring resonators according to the laser of this embodiment. According to this embodiment, the first laser beam that resonates in the first laser resonator to be emitted from the first end face 10a of the first SOA 10 is light of the wavelength λ1, at which a resonant wavelength in the first ring resonator 71 and a resonant wavelength in the fifth ring resonator 75 match. Accordingly, other than the fifth ring resonator 75, it is the first ring resonator 71 that is a ring resonator whose resonant wavelength coincides with the wavelength λ1, and it is the second ring resonator 72 and the third ring resonator 73 that are ring resonators whose resonant wavelengths do not coincide with the wavelength λ1. Furthermore, it is the second wavelength selective mirror 62 that is a wavelength selective mirror whose selected wavelength coincides with the wavelength λ1, and it is the third wavelength selective mirror 63 that is a wavelength selective mirror whose selected wavelength does not coincide with the wavelength λ1. Accordingly, the wavelength λ1 coincides with a resonant wavelength in the seventh ring resonator 77, and does not coincide with any resonant wavelength in the eighth ring resonator 78.

Furthermore, the second laser beam that resonates in the second laser resonator to be emitted from the first end face 20a of the second SOA 20 is light of the wavelength λ2, at which a resonant wavelength in the second ring resonator 72 and a resonant wavelength in the fifth ring resonator 75 match. Accordingly, other than the fifth ring resonator 75, it is the second ring resonator 72 that is a ring resonator whose resonant wavelength coincides with the wavelength λ2, and it is the first ring resonator 71 and the fourth ring resonator 74 that are ring resonators whose resonant wavelengths do not coincide with the wavelength λ2. Furthermore, it is the first wavelength selective mirror 61 that is a wavelength selective mirror whose selected wavelength coincides with the wavelength λ2, and it is the fourth wavelength selective mirror 64 that is a wavelength selective mirror whose selected wavelength does not coincide with the wavelength λ2. Accordingly, the wavelength λ2 coincides with a resonant wavelength in the sixth ring resonator 76, and does not coincide with any resonant wavelength in the ninth ring resonator 79.

Furthermore, the third laser beam that resonates in the third laser resonator to be emitted from the first end face 30a of the third SOA 30 is light of the wavelength λ3, at which a resonant wavelength in the third ring resonator 73 and a resonant wavelength in the fifth ring resonator 75 match. Accordingly, other than the fifth ring resonator 75, it is the third ring resonator 73 that is a ring resonator whose resonant wavelength coincides with the wavelength λ3, and it is the first ring resonator 71 and the fourth ring resonator 74 that are ring resonators whose resonant wavelengths do not coincide with the wavelength λ3. Furthermore, it is the fourth wavelength selective mirror 64 that is a wavelength selective mirror whose selected wavelength coincides with the wavelength λ3, and it is the first wavelength selective mirror 61 that is a wavelength selective mirror whose selected wavelength does not coincide with the wavelength λ3. Accordingly, the wavelength λ3 coincides with a resonant wavelength in the ninth ring resonator 79, and does not coincide with any resonant wavelength in the sixth ring resonator 76.

Furthermore, the fourth laser beam that resonates in the fourth laser resonator to be emitted from the first end face 40a of the fourth SOA 40 is light of the wavelength λ4, at which a resonant wavelength in the fourth ring resonator 74 and a resonant wavelength in the fifth ring resonator 75 match. Accordingly, other than the fifth ring resonator 75, it is the fourth ring resonator 74 that is a ring resonator whose resonant wavelength coincides with the wavelength λ4, and it is the second ring resonator 72 and the third ring resonator 73 that are ring resonators whose resonant wavelengths do not coincide with the wavelength λ4. Furthermore, it is the third wavelength selective mirror 63 that is a wavelength selective mirror whose selected wavelength coincides with the wavelength λ4, and it is the second wavelength selective mirror 62 that is a wavelength selective mirror whose selected wavelength does not coincide with the wavelength λ4. Accordingly, the wavelength λ4 coincides with a resonant wavelength in the eighth ring resonator 78, and does not coincide with any resonant wavelength in the seventh ring resonator 77.

Next, the laser according to this embodiment is described in more detail with reference to FIGS. 8 through 11.

Referring to FIG. 8, the first laser beam of the wavelength λ1 emitted from the first end face 10a of the first SOA 10 is produced by laser oscillation by causing light exiting from the first SOA 10 to resonate. Specifically, light exiting from the second end face 10b of the first SOA 10 propagates through the first optical waveguide 91. Of the light propagating through the first optical waveguide 91, only light of a wavelength matching a resonant wavelength in the first ring resonator 71 propagates to the first ring resonator 71 as drop light, and other light becomes through light. The light propagating to the first ring resonator 71 propagates further to the second optical waveguide 92. Of the light propagating through the second optical waveguide 92, only light of a wavelength matching a resonant wavelength in the fifth ring resonator 75 propagates to the fifth ring resonator 75 as drop light, and other light becomes through light. That is, of the light of resonant wavelengths that has become drop light in the first ring resonator 71, only light of the wavelength λ1 that matches a resonant wavelength in the fifth ring resonator 75 propagates to the fifth ring resonator 75 as drop light, and other light becomes through light.

The light of the wavelength λ1 propagating to the fifth ring resonator 75 propagates further to the fourth optical waveguide 94 to pass by the second ring resonator 72. The wavelength λ1 at which a resonant wavelength of the first ring resonator 71 and a resonant wavelength of the fifth ring resonator 75 match, however, is not a resonant wavelength of the second ring resonator 72. Therefore, the light of the wavelength λ1 propagating through the fourth optical waveguide 94 becomes through light in the second wavelength selective filter 52 without propagating to the second ring resonator 72.

Accordingly, the light of the wavelength λ1 propagating through the fourth optical waveguide 94 is reflected from the second wavelength selective mirror 62 to return to the first SOA 10, traveling back the same path. In the second wavelength selective mirror 62, the light of the wavelength λ1 propagating through the fourth optical waveguide 94 propagates to the seventh ring resonator 77 and further to the eighth optical waveguide 98 to be reflected from the second loop mirror 82 provided at the end 98a of the eighth optical waveguide 98.

Referring to FIG. 9, the second laser beam of the wavelength λ2 emitted from the first end face 20a of the second SOA 20 is produced by laser oscillation by causing light exiting from the second SOA 20 to resonate. Specifically, light exiting from the second end face 20b of the second SOA 20 propagates through the third optical waveguide 93. Of the light propagating through the third optical waveguide 93, only light of a wavelength matching a resonant wavelength in the second ring resonator 72 propagates to the second ring resonator 72 as drop light, and other light becomes through light. The light propagating to the second ring resonator 72 propagates further to the fourth optical waveguide 94. Of the light propagating through the fourth optical waveguide 94, only light of a wavelength matching a resonant wavelength in the fifth ring resonator 75 propagates to the fifth ring resonator 75 as drop light, and other light becomes through light. That is, of the light of resonant wavelengths that has become drop light in the second ring resonator 72, only light of the wavelength λ2 that matches a resonant wavelength in the fifth ring resonator 75 propagates to the fifth ring resonator 75 as drop light, and other light becomes through light.

The light of the wavelength λ2 propagating to the fifth ring resonator 75 propagates further to the second optical waveguide 92 to pass by the first ring resonator 71. The wavelength λ2 at which a resonant wavelength of the second ring resonator 72 and a resonant wavelength of the fifth ring resonator 75 match, however, is not a resonant wavelength of the first ring resonator 71. Therefore, the light of the wavelength λ2 propagating through the second optical waveguide 92 becomes through light in the first wavelength selective filter 51 without propagating to the first ring resonator 71.

Accordingly, the light of the wavelength λ2 propagating through the second optical waveguide 92 is reflected from the first wavelength selective mirror 61 to return to the second SOA 20, traveling back the same path. In the first wavelength selective mirror 61, the light of the wavelength λ2 propagating through the second optical waveguide 92 propagates to the sixth ring resonator 76 and further to the seventh optical waveguide 97 to be reflected from the first loop mirror 81 provided at the end 97a of the seventh optical waveguide 97.

Referring to FIG. 10, the third laser beam of the wavelength λ3 emitted from the first end face 30a of the third SOA 30 is produced by laser oscillation by causing light exiting from the third SOA 30 to resonate. Specifically, light exiting from the second end face 30b of the third SOA 30 propagates through the fifth optical waveguide 95. Of the light propagating through the fifth optical waveguide 95, only light of a wavelength matching a resonant wavelength in the third ring resonator 73 propagates to the third ring resonator 73 as drop light, and other light becomes through light. The light propagating to the third ring resonator 73 propagates further to the second optical waveguide 92. Of the light propagating through the second optical waveguide 92, only light of a wavelength matching a resonant wavelength in the fifth ring resonator 75 propagates to the fifth ring resonator 75 as drop light, and other light becomes through light. That is, of the light of resonant wavelengths that has become drop light in the third ring resonator 73, only light of the wavelength λ3 that matches a resonant wavelength in the fifth ring resonator 75 propagates to the fifth ring resonator 75 as drop light, and other light becomes through light.

The light of the wavelength λ3 propagating to the fifth ring resonator 75 propagates further to the fourth optical waveguide 94 to pass by the fourth ring resonator 74. The wavelength λ3 at which a resonant wavelength of the third ring resonator 73 and a resonant wavelength of the fifth ring resonator 75 match, however, is not a resonant wavelength of the fourth ring resonator 74. Therefore, the light of the wavelength λ3 propagating through the fourth optical waveguide 94 becomes through light in the fourth wavelength selective filter 54 without propagating to the fourth ring resonator 74.

Accordingly, the light of the wavelength λ3 propagating through the fourth optical waveguide 94 is reflected from the fourth wavelength selective mirror 64 to return to the third SOA 30, traveling back the same path. In the fourth wavelength selective mirror 64, the light of the wavelength λ3 propagating through the fourth optical waveguide 94 propagates to the ninth ring resonator 79 and further to the tenth optical waveguide 100 to be reflected from the fourth loop mirror 84 provided at the end 100a of the tenth optical waveguide 100.

Referring to FIG. 11, the fourth laser beam of the wavelength λ4 emitted from the first end face 40a of the fourth SOA 40 is produced by laser oscillation by causing light exiting from the fourth SOA 40 to resonate. Specifically, light exiting from the second end face 40b of the fourth SOA 40 propagates through the sixth optical waveguide 96. Of the light propagating through the sixth optical waveguide 96, only light of a wavelength matching a resonant wavelength in the fourth ring resonator 74 propagates to the fourth ring resonator 74 as drop light, and other light becomes through light. The light propagating to the fourth ring resonator 74 propagates further to the fourth optical waveguide 94. Of the light propagating through the fourth optical waveguide 94, only light of a wavelength matching a resonant wavelength in the fifth ring resonator 75 propagates to the fifth ring resonator 75 as drop light, and other light becomes through light. That is, of the light of resonant wavelengths that has become drop light in the fourth ring resonator 74, only light of the wavelength λ4 that matches a resonant wavelength in the fifth ring resonator 75 propagates to the fifth ring resonator 75 as drop light, and other light becomes through light.

The light of the wavelength λ4 propagating to the fifth ring resonator 75 propagates further to the second optical waveguide 92 to pass by the third ring resonator 73. The wavelength λ4 at which a resonant wavelength of the fourth ring resonator 74 and a resonant wavelength of the fifth ring resonator 75 match, however, is not a resonant wavelength of the third ring resonator 73. Therefore, the light of the wavelength λ4 propagating through the second optical waveguide 92 becomes through light in the third wavelength selective filter 53 without propagating to the third ring resonator 73.

Accordingly, the light of the wavelength λ4 propagating through the second optical waveguide 92 is reflected from the third wavelength selective mirror 63 to return to the fourth SOA 40, traveling back the same path. In the third wavelength selective mirror 63, the light of the wavelength λ4 propagating through the second optical waveguide 92 propagates to the eighth ring resonator 78 and further to the ninth optical waveguide 99 to be reflected from the third loop mirror 83 provided at the end 99a of the ninth optical waveguide 99.

The laser according to this embodiment includes the first wavelength selective mirror 61 that includes the sixth ring resonator 76 for wavelength selection. The resonant wavelengths of the sixth ring resonator 76 are the same as the resonant wavelengths of the second ring resonator 72, but are different from the resonant wavelengths of the first ring resonator 71 and the resonant wavelengths of the fourth ring resonator 74.

Referring to FIG. 10, in the third laser resonator of this embodiment, a laser beam that becomes drop light of the third ring resonator 73 and through light of the fifth ring resonator 75 propagates through the second optical waveguide 92 toward the first wavelength selective mirror 61. Here, if a total reflection mirror is used in place of the first wavelength selective mirror 61, through light of the fifth ring resonator 75 is all reflected from the total reflection mirror to return to the third SOA 30 via the third ring resonator 73. In this case, a laser beam of a wavelength that is different from the desired wavelength λ3 as well is emitted from the first end face 30a of the third SOA 30. That is, because a laser resonator different from the third laser resonator is formed between the partially reflecting mirror 31 in the third SOA 30 and the total reflection mirror, all of laser beams of the resonant wavelengths of the third ring resonator 73 are emitted. Accordingly, in this case, laser beams of wavelengths other than a desired wavelength as well are emitted from the first end face 30a of the third SOA 30. Therefore, it is impossible to emit only a laser beam of a desired wavelength, namely, the third laser beam of the wavelength λ3.

According to this embodiment, the first wavelength selective mirror 61 including the sixth ring resonator 76 that is different in resonant wavelength from the third ring resonator 73 is provided. Accordingly, a laser beam that becomes drop light of the third ring resonator 73 and through light of the fifth ring resonator 75, which is different from a selected wavelength in the first wavelength selective mirror 61, is not reflected from the first wavelength selective mirror 61, and accordingly, does not return to the third SOA 30. As a result, it is possible to emit only a laser beam of a desired wavelength, namely, the third laser beam of the wavelength λ3, from the first end face 30a of the third SOA 30.

Referring to FIG. 7, according to this embodiment, the resonant wavelengths of the sixth ring resonator 76 are equal to the resonant wavelengths of the second ring resonator 72. Accordingly, as depicted in FIG. 9, in the second laser resonator, a laser beam of a wavelength selected in the second wavelength selective filter 52 including the second ring resonator 72 is also selected in the sixth ring resonator 76, and is therefore reflected from the first wavelength selective mirror 61. Therefore, with the first wavelength selective mirror 61, the second laser beam of the wavelength λ2 emitted from the second SOA 20 in the second laser resonator can still have characteristics equivalent to those in the case of using a simple total reflection mirror.

Furthermore, the laser according to this embodiment includes the second wavelength selective mirror 62 that includes the seventh ring resonator 77 for wavelength selection. The resonant wavelengths of the seventh ring resonator 77 are the same as the resonant wavelengths of the first ring resonator 71, but are different from the resonant wavelengths of the second ring resonator 72 and the resonant wavelengths of the third ring resonator 73.

Referring to FIG. 11, in the fourth laser resonator of this embodiment, a laser beam that becomes drop light of the fourth ring resonator 74 and through light of the fifth ring resonator 75 propagates through the fourth optical waveguide 94 toward the second wavelength selective mirror 62. Here, if a total reflection mirror is used in place of the second wavelength selective mirror 62, through light of the fifth ring resonator 75 is all reflected from the total reflection mirror to return to the fourth SOA 40 via the fourth ring resonator 74. In this case, a laser beam of a wavelength that is different from the desired wavelength λ4 as well is emitted from the first end face 40a of the fourth SOA 40. That is, because a laser resonator different from the fourth laser resonator is formed between the partially reflecting mirror 41 in the fourth SOA 40 and the total reflection mirror, all of laser beams of the resonant wavelengths of the fourth ring resonator 74 are emitted. Accordingly, in this case, laser beams of wavelengths other than a desired wavelength as well are emitted from the first end face 40a of the fourth SOA 40. Therefore, it is impossible to emit only a laser beam of a desired wavelength, namely, the fourth laser beam of the wavelength λ4.

According to this embodiment, the second wavelength selective mirror 62 including the seventh ring resonator 77 that is different in resonant wavelength from the fourth ring resonator 74 is provided. Accordingly, a laser beam that becomes drop light of the fourth ring resonator 74 and through light of the fifth ring resonator 75, which is different from a selected wavelength in the second wavelength selective mirror 62, is not reflected from the second wavelength selective mirror 62, and accordingly, does not return to the fourth SOA 40. As a result, it is possible to emit only a laser beam of a desired wavelength, namely, the fourth laser beam of the wavelength λ4, from the first end face 40a of the fourth SOA 40.

Referring to FIG. 7, according to this embodiment, the resonant wavelengths of the seventh ring resonator 77 are equal to the resonant wavelengths of the first ring resonator 71. Accordingly, as depicted in FIG. 8, in the first laser resonator, a laser beam of a wavelength selected in the first wavelength selective filter 51 including the first ring resonator 71 is also selected in the seventh ring resonator 77, and is therefore reflected from the second wavelength selective mirror 62. Therefore, with the second wavelength selective mirror 62, the first laser beam of the wavelength λ1 emitted from the first SOA 10 in the first laser resonator can still have characteristics equivalent to those in the case of using a simple total reflection mirror.

Furthermore, the laser according to this embodiment includes the third wavelength selective mirror 63 that includes the eighth ring resonator 78 for wavelength selection. The resonant wavelengths of the eighth ring resonator 78 are the same as the resonant wavelengths of the fourth ring resonator 74, but are different from the resonant wavelengths of the second ring resonator 72 and the resonant wavelengths of the third ring resonator 73.

Referring to FIG. 8, in the first laser resonator of this embodiment, a laser beam that becomes drop light of the first ring resonator 71 and through light of the fifth ring resonator 75 propagates through the second optical waveguide 92 toward the third wavelength selective mirror 63. Here, if a total reflection mirror is used in place of the third wavelength selective mirror 63, through light of the fifth ring resonator 75 is all reflected from the total reflection mirror to return to the first SOA 10 via the first ring resonator 71. In this case, a laser beam of a wavelength that is different from the desired wavelength λ1 as well is emitted from the first end face 10a of the first SOA 10. That is, because a laser resonator different from the first laser resonator is formed between the partially reflecting mirror 11 in the first SOA 10 and the total reflection mirror, all of laser beams of the resonant wavelengths of the first ring resonator 71 are emitted. Accordingly, in this case, laser beams of wavelengths other than a desired wavelength as well are emitted from the first end face 10*a* of the first SOA 10. Therefore, it is impossible to emit only a laser beam of a desired wavelength, namely, the first laser beam of the wavelength λ1.

According to this embodiment, the third wavelength selective mirror 63 including the eighth ring resonator 78 that is different in resonant wavelength from the first ring resonator 71 is provided. Accordingly, a laser beam that becomes drop light of the first ring resonator 71 and through light of the fifth ring resonator 75, which is different from a selected wavelength in the third wavelength selective mirror 63, is not reflected from the third wavelength selective mirror 63, and accordingly, does not return to the first SOA 10. As a result, it is possible to emit only a laser beam of a desired wavelength, namely, the first laser beam of the wavelength λ1, from the first end face 10*a* of the first SOA 10.

Referring to FIG. 7, according to this embodiment, the resonant wavelengths of the eighth ring resonator 78 are equal to the resonant wavelengths of the fourth ring resonator 74. Accordingly, as depicted in FIG. 11, in the fourth laser resonator, a laser beam of a wavelength selected in the fourth wavelength selective filter 54 including the fourth ring resonator 74 is also selected in the eighth ring resonator 78, and is therefore reflected from the third wavelength selective mirror 63. Therefore, with the third wavelength selective mirror 63, the fourth laser beam of the wavelength λ4 emitted from the fourth SOA 40 in the fourth laser resonator can still have characteristics equivalent to those in the case of using a simple total reflection mirror.

Furthermore, the laser according to this embodiment includes the fourth wavelength selective mirror 64 that includes the ninth ring resonator 79 for wavelength selection. The resonant wavelengths of the ninth ring resonator 79 are the same as the resonant wavelengths of the third ring resonator 73, but are different from the resonant wavelengths of the first ring resonator 71 and the resonant wavelengths of the fourth ring resonator 74.

Referring to FIG. 9, in the second laser resonator of this embodiment, a laser beam that becomes drop light of the second ring resonator 72 and through light of the fifth ring resonator 75 propagates through the fourth optical waveguide 94 toward the fourth wavelength selective mirror 64. Here, if a total reflection mirror is used in place of the fourth wavelength selective mirror 64, through light of the fifth ring resonator 75 is all reflected from the total reflection mirror to return to the second SOA 20 via the second ring resonator 72. In this case, a laser beam of a wavelength that is different from the desired wavelength λ2 as well is emitted from the first end face 20*a* of the second SOA 20. That is, because a laser resonator different from the second laser resonator is formed between the partially reflecting mirror 21 in the second SOA 20 and the total reflection mirror, all of laser beams of the resonant wavelengths of the second ring resonator 72 are emitted. Accordingly, in this case, laser beams of wavelengths other than a desired wavelength as well are emitted from the first end face 20*a* of the second SOA 20. Therefore, it is impossible to emit only a laser beam of a desired wavelength, namely, the second laser beam of the wavelength λ2.

According to this embodiment, the fourth wavelength selective mirror 64 including the ninth ring resonator 79 that is different in resonant wavelength from the second ring resonator 72 is provided. Accordingly, a laser beam that becomes drop light of the second ring resonator 72 and through light of the fifth ring resonator 75, which is different from a selected wavelength in the fourth wavelength selective mirror 64, is not reflected from the fourth wavelength selective mirror 64, and accordingly, does not return to the second SOA 20. As a result, it is possible to emit only a laser beam of a desired wavelength, namely, the second laser beam of the wavelength λ2, from the first end face 20*a* of the second SOA 20.

Referring to FIG. 7, according to this embodiment, the resonant wavelengths of the ninth ring resonator 79 are equal to the resonant wavelengths of the third ring resonator 73. Accordingly, as depicted in FIG. 10, in the third laser resonator, a laser beam of a wavelength selected in the third wavelength selective filter 53 including the third ring resonator 73 is also selected in the ninth ring resonator 79, and is therefore reflected from the fourth wavelength selective mirror 64. Therefore, with the fourth wavelength selective mirror 64, the third laser beam of the wavelength λ3 emitted from the third SOA 30 in the first laser resonator can still have characteristics equivalent to those in the case of using a simple total reflection mirror.

Thus, according to the laser of this embodiment, light exiting from the first SOA 10 does not arrive at any of the second SOA 20, the third SOA 30, and the fourth SOA 40. Furthermore, light exiting from the second SOA 20 does not arrive at any of the first SOA 10, the third SOA 30, and the fourth SOA 40. Furthermore, light exiting from the third SOA 30 does not arrive at any of the first SOA 10, the second SOA 20, and the fourth SOA 40. Furthermore, light exiting from the fourth SOA 40 does not arrive at any of the first SOA 10, the second SOA 20, and the third SOA 30.

Accordingly, a laser beam emitted from the first SOA 10, a laser beam emitted from the second SOA 20, a laser beam emitted from the third SOA 30, and a laser beam emitted from the fourth SOA 40 are produced by independent laser oscillation to have wavelengths different from one another.

Furthermore, light exiting from the second end face 10*b* of the first SOA 10 and light exiting from the second end face 20*b* of the second SOA 20 both pass through the fifth ring resonator 75. Therefore, each of the wavelength λ1 and the wavelength λ2, which are their respective oscillation wavelengths, coincides with one of the resonant wavelengths of the fifth ring resonator 75. Accordingly, the oscillation wavelength interval between a laser beam emitted from the first SOA 10 and a laser beam emitted from the second SOA 20 (|λ1−λ2|) is always an integral multiple of the FSR of the fifth ring resonator 75. Accordingly, it is possible to accurately set the wavelength interval.

Furthermore, light exiting from the second end face 20*b* of the second SOA 20 and light exiting from the second end face 30*b* of the third SOA 30 both pass through the fifth ring resonator 75. Therefore, each of the wavelength λ2 and the wavelength λ3, which are their respective oscillation wavelengths, coincides with one of the resonant wavelengths of the fifth ring resonator 75. Accordingly, the oscillation wavelength interval between a laser beam emitted from the second SOA 20 and a laser beam emitted from the third SOA 30 (|λ2−λ3|) is always an integral multiple of the FSR of the fifth ring resonator 75. Accordingly, it is possible to accurately set the wavelength interval.

Furthermore, light exiting from the second end face 30*b* of the third SOA 30 and light exiting from the second end face 40*b* of the fourth SOA 40 both pass through the fifth ring resonator 75. Therefore, each of the wavelength λ3 and the wavelength λ4, which are their respective oscillation wavelengths, coincides with one of the resonant wavelengths of the fifth ring resonator 75. Accordingly, the oscillation wavelength interval between a laser beam emitted from the third SOA 30 and a laser beam emitted from the fourth SOA 40 ($|\lambda 3-\lambda 4|$) is always an integral multiple of the FSR of the fifth ring resonator 75. Accordingly, it is possible to accurately set the wavelength interval.

Accordingly, for example, if the FSR of the fifth ring resonator 75 is 25 GHz, the laser of this embodiment can emit four laser beams of different wavelengths whose wavelength interval is an integral multiple of 25 GHz.

Furthermore, the laser of this embodiment makes it possible to output four laser beams of different wavelengths simply with a single laser. Therefore, the laser of this embodiment can reduce cost per wavelength compared with a laser that outputs a single or two laser beams.

According to the laser of this embodiment, for example, light of the wavelength $\lambda 1$ selected by the fifth ring resonator 75 and the first ring resonator 71 is prevented from propagating to the second ring resonator 72 in order to make the first laser beam emitted from the first SOA 10 and the second laser beam emitted from the second SOA 20 independent of each other. Specifically, the resonant wavelengths of the ring resonators and positions at which the ring resonators are formed may be adjusted to make the wavelength $\lambda 1$ and the wavelength $\lambda 2$ different from each other. Practically, the sharpness (finesse) of their respective resonant wavelengths is also considered.

Figure 13:
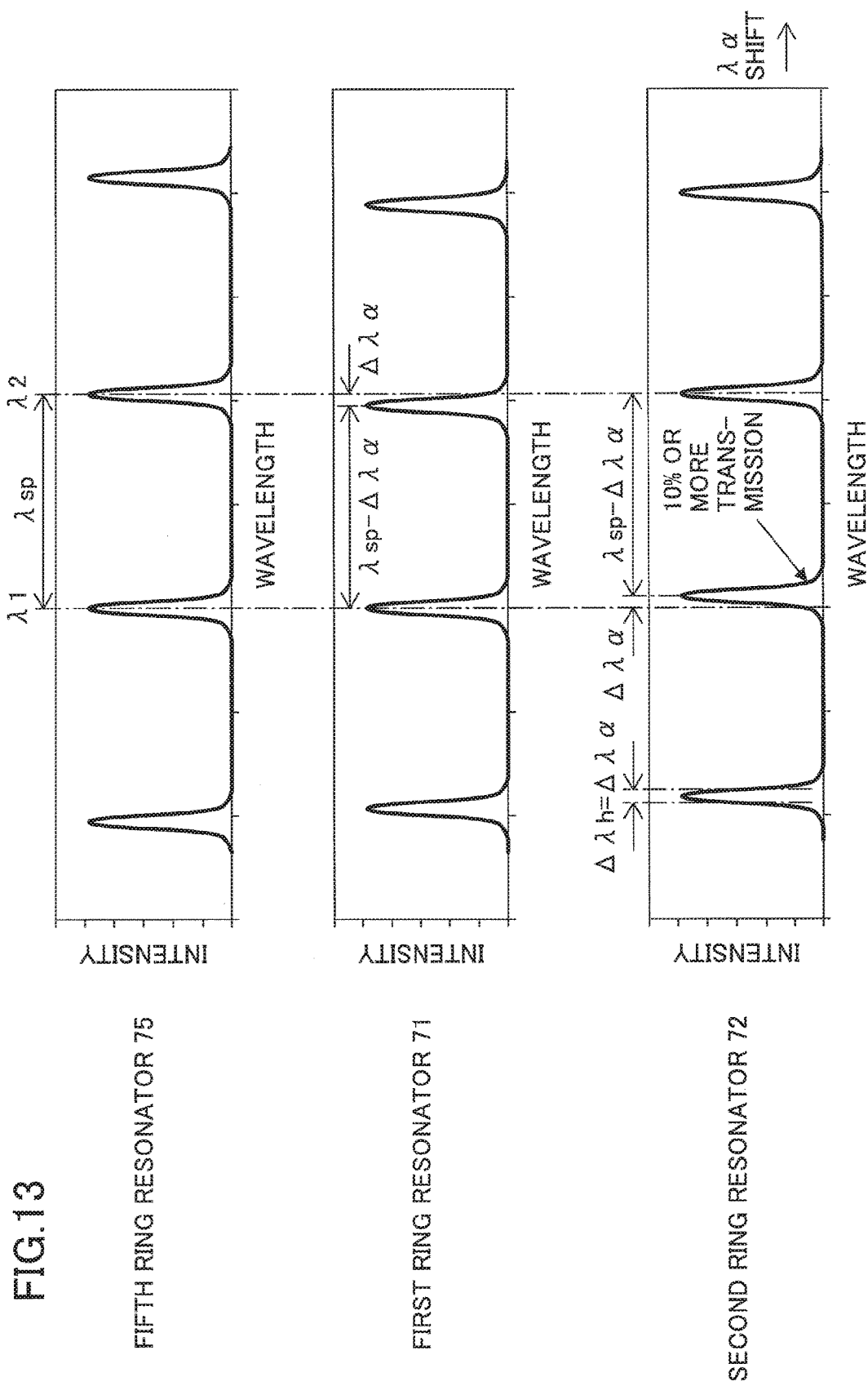
FIG. 13 is a diagram illustrating resonant wavelengths of the laser according to this embodiment.

Here, with reference to FIG. 13, the case where the wavelength $\lambda 1$ and the wavelength $\lambda 2$ are resonant wavelengths adjacent to each other among the periodic resonant wavelengths of the fifth ring resonator 75 is considered as the case where the highest finesse is required.

It is assumed that the FSR of the fifth ring resonator 75 is $\lambda sp$, that the FSR of the first ring resonator 71 and the second ring resonator 72 is $\lambda sp-\Delta\lambda\alpha$, and that the wavelength $\lambda 2$ is the wavelength next to the wavelength $\lambda 1$ on its long-wave side among the resonant wavelengths of the fifth ring resonator 75. In this case, $\lambda 2=\lambda 1+\lambda sp$.

One of the resonant wavelengths of the second ring resonator 72 coincides with $\lambda 2$, and the resonant wavelength of the second ring resonator 72 that is next to $\lambda 2$ on its short-wave side is $\lambda 2-(\lambda sp-\Delta\lambda\alpha)=\lambda 1+\Delta\lambda\alpha$.

Accordingly, the resonant wavelength of the second ring resonator 72 closest to the wavelength $\lambda 1$ at which a resonant wavelength of the first ring resonator 71 and a resonant wavelength of the fifth ring resonator 75 match is apart from the wavelength $\lambda 1$ by $\Delta\lambda\alpha$ that is the FSR difference. Consideration is given to the case where the ring resonators are low in finesse, for example, where the full width at half maximum (FWHM) $\Delta\lambda h$ of each resonant wavelength is approximately equal to $\leftarrow\lambda\alpha$ as depicted in FIG. 13. In this case, although the peak of a resonant wavelength of the second ring resonator 72 is off the wavelength $\lambda 1$ by $\Delta\lambda\alpha$, 10% or more of light of the wavelength $\lambda 1$ becomes drop light of the second ring resonator 72 to arrive at the second SOA 20. Therefore, it is difficult for the first laser resonator and the second laser resonator to operate independent of each other.

Figure 14:
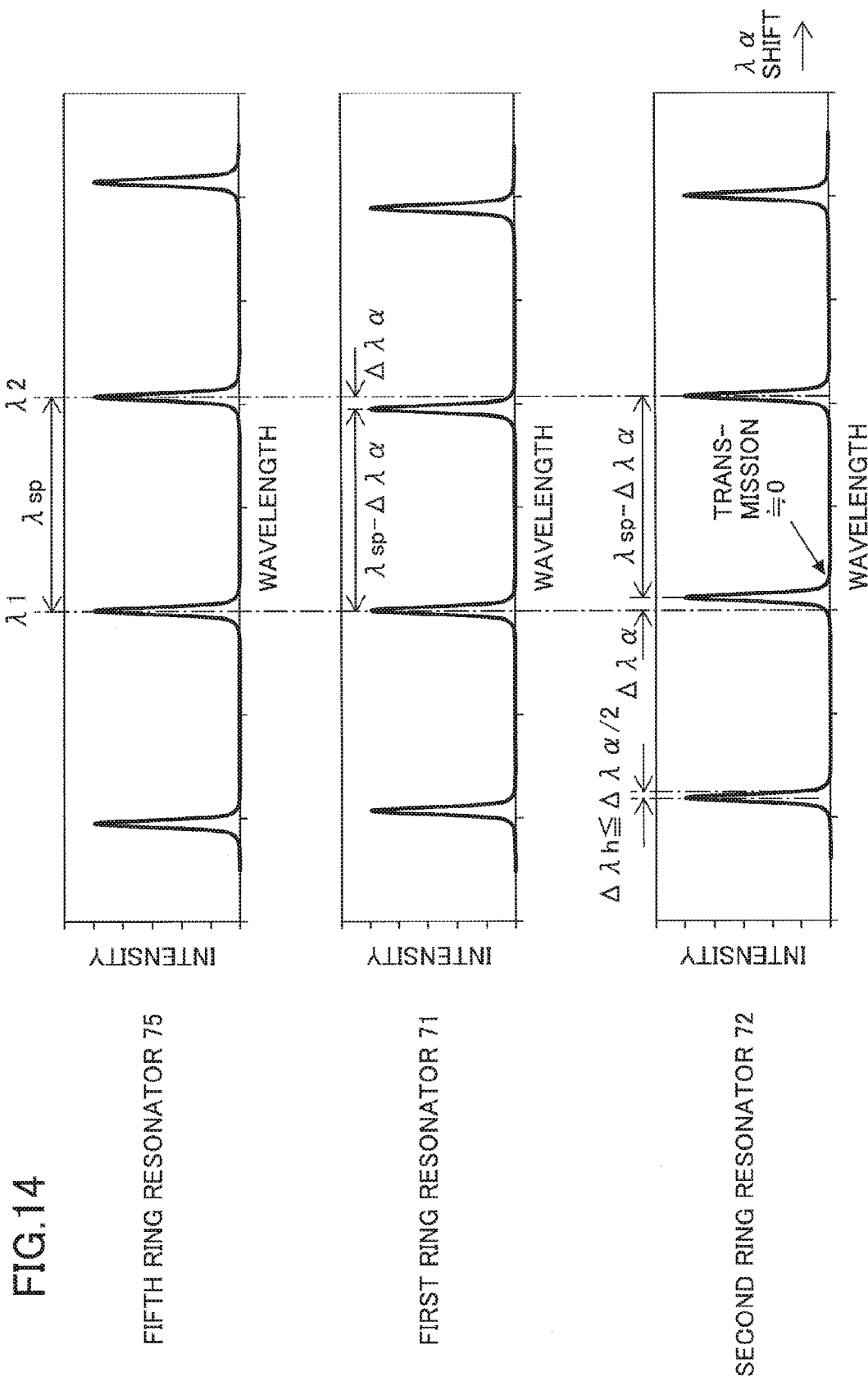
FIG. 14 is a diagram illustrating resonant wavelengths of the laser according to this embodiment.

Accordingly, in order for the first laser resonator and the second laser resonator to stably operate independent of each other, the FWHM $\Delta\lambda h$ of the resonant wavelengths of each ring resonator is preferably less than or equal to $\Delta\lambda\alpha/2$ as depicted in FIG. 14.

In the above description, by way of example, the first ring resonator 71 is described as a ring resonator whose resonant wavelength coincides with a particular wavelength and the second ring resonator 72 is described as a ring resonator whose resonant wavelength does not coincide with the particular wavelength. According to this embodiment, this relationship, namely, the relationship between a ring resonator whose resonant wavelength coincides with a particular wavelength and a ring resonator whose resonant wavelength does not coincide with the particular wavelength, applies the same to other pairs of a ring resonator whose resonant wavelength coincides with a particular wavelength and a ring resonator whose resonant wavelength does not coincide with the particular wavelength.

Furthermore, according to this embodiment, the first ring resonator 71, the second ring resonator 72, the third ring resonator 73, the fourth ring resonator 74, the fifth ring resonator 75, the sixth ring resonator 76, the seventh ring resonator 77, the eighth ring resonator 78, and the ninth ring resonator 79 are described as being formed of silicon waveguides. This embodiment, however, is not limited to this configuration. For example, the first through ninth ring resonators 71 through 79 may be formed of silica-based optical waveguides or optical waveguides using a compound semiconductor material such as InP. When the first through ninth ring resonators 71 through 79 are formed of a compound semiconductor material such as InP, it is possible to monolithically integrate the optical waveguides forming the first through ninth ring resonators 71 through 79, the first SOA 10, the second SOA 20, the third SOA 30, and the fourth SOA 40. Therefore, it is possible to reduce the size of and simplify mounting of a laser.

Furthermore, according to this embodiment, the FSR of the first ring resonator 71 and the second ring resonator 72 is described as being narrower than the FSR of the fifth ring resonator 75, and the FSR of the first ring resonator 71 and the FSR of the second ring resonator 72 are described as being the same. The above-described embodiment, however, is not limited to this configuration. For example, the FSR of the first ring resonator 71 and the FSR of the second ring resonator 72 may be different.

When a resonant wavelength of the first ring resonator 71 and a resonant wavelength of the second ring resonator 72 are offset while the FSR of the first ring resonator 71 and the FSR of the second ring resonator 72 are equal, resonant wavelengths are globally offset in other wavelength regions as well. Therefore, in this case, there is the advantage that there is no need to care about the coincidence of resonant wavelengths between the first ring resonator 71 and the second ring resonator 72.

Furthermore, the other end of the first optical waveguide 91, the other end of the third optical waveguide 93, the other end of the fifth optical waveguide 95, the other end of the sixth optical waveguide 96, both ends of the second optical waveguide 92, and both ends of the fourth optical waveguide 94 are preferably subjected to anti-reflective treatment.

While the heater electrodes 71a through 79a are formed on the ring parts of the ring resonators 71 through 79, phase adjustment heater electrodes (not depicted) for adjusting the positions of resonator longitudinal modes may be additionally formed. For example, first phase adjustment heater electrodes (not depicted) may be formed in the first optical waveguide 91 between the first SOA 10 and the first ring resonator 71, second phase adjustment heater electrodes (not depicted) may be formed in the third optical waveguide 93 between the second SOA 20 and the second ring resonator 72, third phase adjustment heater electrodes (not depicted) may be formed in the fifth optical waveguide 95 between the third SOA 30 and the third ring resonator 73, and fourth phase adjustment heater electrodes (not depicted) may be formed in the sixth optical waveguide 96 between the fourth SOA 40 and the fourth ring resonator 74. As a result, it is possible to adjust the positions of resonator longitudinal modes in the first laser resonator, the second laser resonator, the third laser resonator, and the fourth laser resonator independent of one another.

[b] Second Embodiment

Figure 15:
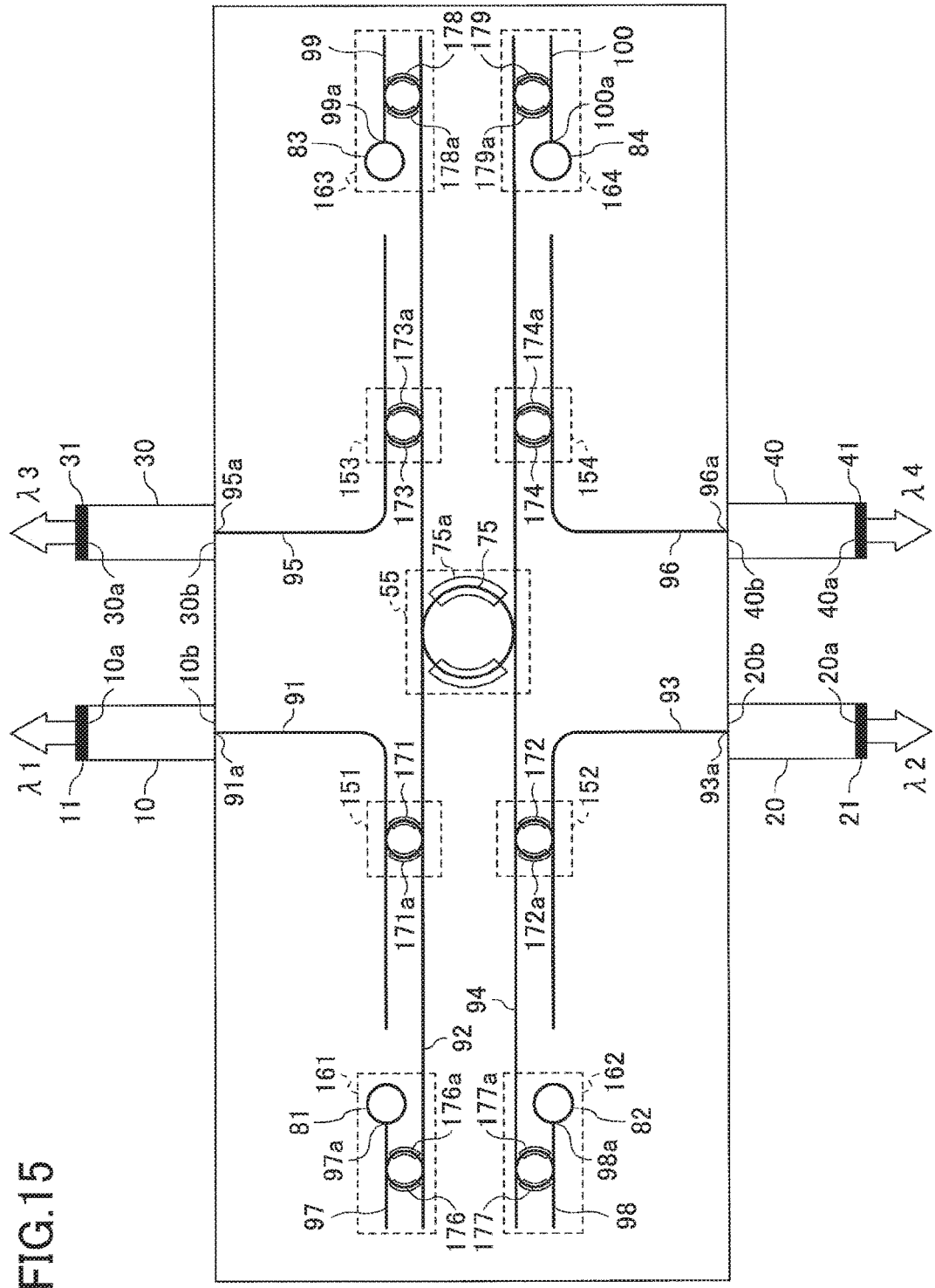
FIG. 15 is a diagram depicting a structure of a laser according to a second embodiment.

Next, a second embodiment is described. According to a laser of this embodiment, as depicted in FIG. 15, a first ring resonator 171, a second ring resonator 172, a third ring resonator 173, a fourth ring resonator 174, a sixth ring resonator 176, a seventh ring resonator 177, an eighth ring resonator 178, and a ninth ring resonator 179 are smaller in radius than the first through fourth ring resonators 71 through 74 and the sixth through ninth ring resonators 76 through 79 of the first embodiment.

According to this embodiment, a first wavelength selective filter 151 includes the first ring resonator 171, a second wavelength selective filter 152 includes the second ring resonator 172, a third wavelength selective filter 153 includes the third ring resonator 173, and a fourth wavelength selective filter 154 includes the fourth ring resonator 174. Furthermore, a first wavelength selective mirror 161 includes the sixth ring resonator 176, a second wavelength selective mirror 162 includes the seventh ring resonator 177, a third wavelength selective mirror 163 includes the eighth ring resonator 178, and a fourth wavelength selective mirror 164 includes the ninth ring resonator 179.

Figure 16:
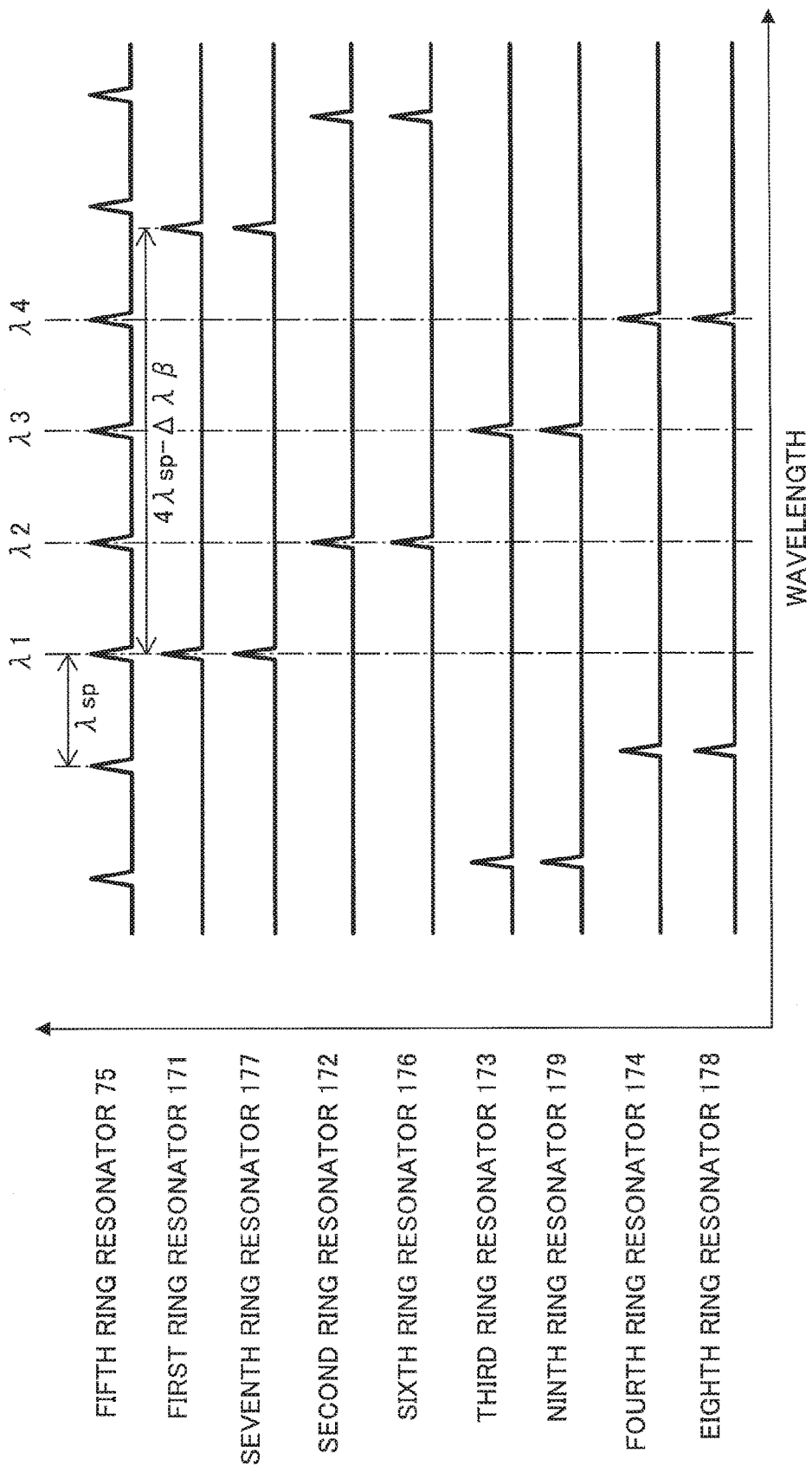
FIG. 16 is a diagram illustrating resonant wavelengths of the laser according to the second embodiment.

Referring to FIG. 16, according to the laser of this embodiment, while the FSR of the fifth ring resonator 75 is $\lambda$sp, the FSR of the first ring resonator 171, the second ring resonator 172, the third ring resonator 173, and the fourth ring resonator 174 is 4$\lambda$sp–$\Delta\lambda\beta$. That is, while the FSR of the first ring resonator 71, the second ring resonator 72, the third ring resonator 73, and the fourth ring resonator 74 is slightly different from the FSR of the fifth ring resonator 75 according to the first embodiment, the FSR of the first ring resonator 171, the second ring resonator 172, the third ring resonator 173, and the fourth ring resonator 174 is slightly different from the quadruple of the FSR of the fifth ring resonator 75 according to this embodiment. For example, the fifth ring resonator 75 is formed with a radius of approximately 475 μm to have an FSR of 25 GHz, while the first ring resonator 171, the second ring resonator 172, the third ring resonator 173, and the fourth ring resonator 174 are formed with a radius of approximately 125 μm to have an FSR of 98.75 GHz, which is 25 GHz×–1.25 GHz.

Here, consideration is given to the case where the wavelength $\lambda$1, the wavelength $\lambda$2, the wavelength $\lambda$3, and the wavelength $\lambda$4 are four adjacent resonant wavelengths of the fifth ring resonator 75 the same as in the first embodiment as depicted in FIG. 16. Letting the wavelength $\lambda$2, the wavelength $\lambda$3, and the wavelength $\lambda$4 be the resonant wavelength of the fifth ring resonator 75 next to the wavelength $\lambda$1 on its long-wave side, the resonant wavelength of the fifth ring resonator 75 second next to the wavelength $\lambda$1 on its long-wave side, and the resonant wavelength of the fifth ring resonator 75 third next to the wavelength $\lambda$1 on its long-wave side, respectively, the wavelength $\lambda$2, the wavelength $\lambda$3, and the wavelength $\lambda$4 are expressed by $\lambda$2=$\lambda$1+$\lambda$sp, $\lambda$3=$\lambda$1+2×$\lambda$sp, and $\lambda$4=$\lambda$1+3×$\lambda$sp, respectively.

In this case, for example, resonant wavelengths in the second ring resonator 172, the third ring resonator 173, and the fourth ring resonator 174 are apart from the wavelength $\lambda$1, at which a resonant wavelength of the first ring resonator 171 and a resonant wavelength of the fifth ring resonator 75 match, by approximately $\lambda$sp, which is the resonant wavelength interval of the fifth ring resonator 75, or approximately the double of $\lambda$sp. Accordingly, resonant wavelengths of other resonators, namely, the second ring resonator 172, the third ring resonator 173, and the fourth ring resonator 174, can be made more apart from the wavelength $\lambda$1, at which a resonant wavelength of the first ring resonator 171 and a resonant wavelength of the fifth ring resonator 75 match, than in the laser of the first embodiment. As a result, it is possible to cause laser oscillation in the four lasers independent of one another without significantly increasing the finesse of the ring resonators.

According to this embodiment, the FSR of the first ring resonator 171, the second ring resonator 172, the third ring resonator 173, and the fourth ring resonator 174 is described as being approximately the quadruple of the FSR of the fifth ring resonator 75. The above-described embodiment, however, is not limited to this configuration. For example, the FSR of the first ring resonator 171, the second ring resonator 172, the third ring resonator 173, and the fourth ring resonator 174 may be approximately N times the FSR of the fifth ring resonator 75 (where N is an integer greater than or equal to two), namely, N×$\lambda$sp–$\Delta\lambda\beta$. In this case as well, it is possible to reduce a requirement for finesse in the ring resonators in the same manner.

In other respects than those described above, the second embodiment may be the same as the first embodiment. For example, as depicted in FIG. 15, heater electrodes 171a are formed on a ring part of the first ring resonator 171, heater electrodes 172a are formed on a ring part of the second ring resonator 172, and heater electrodes 173a are formed on a ring part of the third ring resonator 173. Furthermore, heater electrodes 174a are formed on a ring part of the fourth ring resonator 174, and heater electrodes 176a are formed on a ring part of the sixth ring resonator 176. Furthermore, heater electrodes 177a are formed on a ring part of the seventh ring resonator 177, heater electrodes 178a are formed on a ring part of the eighth ring resonator 178, and heater electrodes 179a are formed on a ring part of the ninth ring resonator 179.

[c] Third Embodiment

Figure 17:
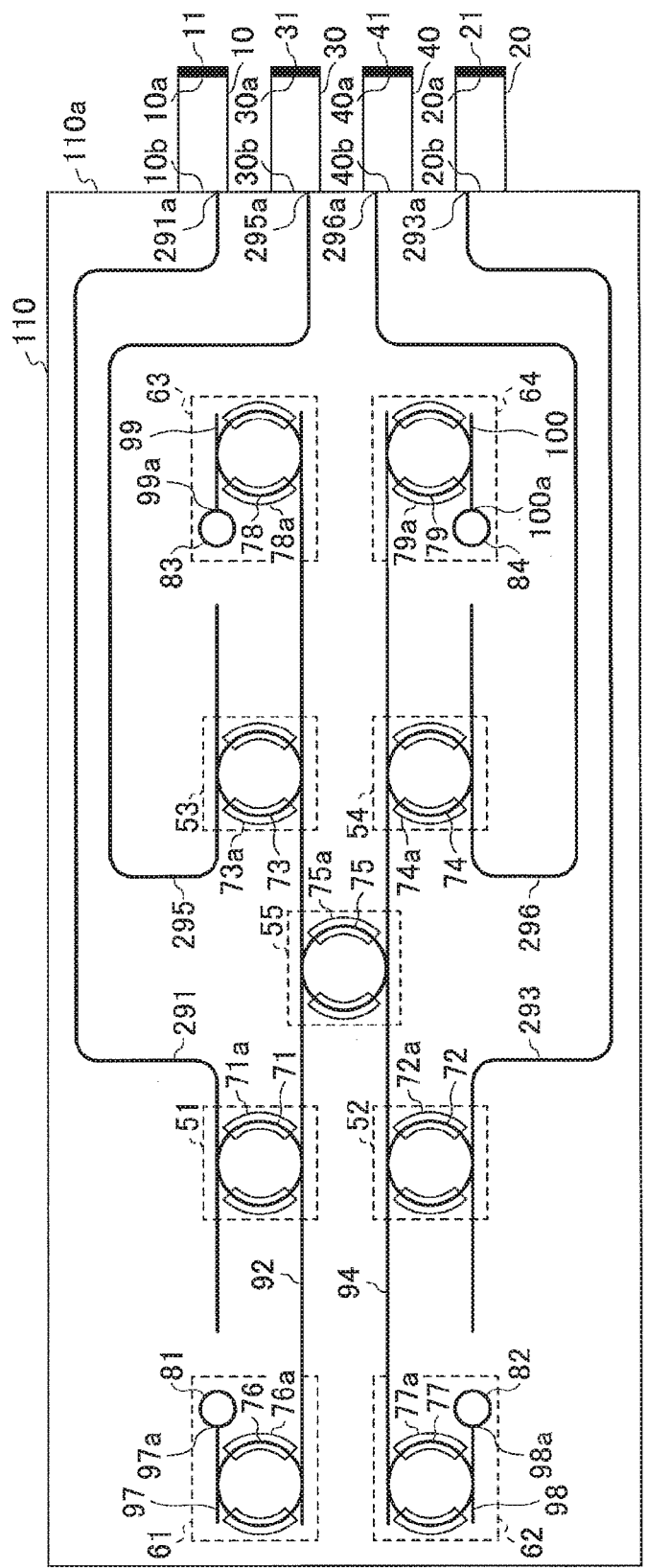
FIG. 17 is a diagram depicting a structure of a laser according to a third embodiment.

Next, a third embodiment is described. Referring to FIG. 17, according to this embodiment, the first SOA 10, the second SOA 20, the third SOA 30, and the fourth SOA 40 of the first embodiment are installed on one side 110a of a quadrangular silicon waveguide chip 110 that forms a laser. By thus installing the first SOA 10, the second SOA 20, the third SOA 30, and the fourth SOA 40 on the side 110a of the silicon waveguide chip 110, it is possible to facilitate optical coupling to, for example, an optical fiber.

Therefore, according to the laser of this embodiment, a first optical waveguide 291 is formed to allow light to exit from either one to enter the other of the second end face 10b of the first SOA 10 and an end 291a of the first optical waveguide 291. Furthermore, the first wavelength selective filter 51 includes the first ring resonator 71, and part of the first optical waveguide 291 and part of the second optical waveguide 92 that are close to the first ring resonator 71. Accordingly, the first ring resonator 71 is formed between the first optical waveguide 291 and the second optical waveguide 92.

Furthermore, a third optical waveguide 293 is formed to allow light to exit from either one to enter the other of the second end face 20b of the second SOA 20 and an end 293a of the third optical waveguide 293. Furthermore, the second wavelength selective filter 52 includes the second ring resonator 72, and part of the third optical waveguide 293 and part of the fourth optical waveguide 94 that are close to the second ring resonator 72. Accordingly, the second ring resonator 72 is formed between the third optical waveguide 293 and the fourth optical waveguide 94.

Furthermore, a fifth optical waveguide 295 is formed to allow light to exit from either one to enter the other of the second end face 30b of the third SOA 30 and an end 295a of the fifth optical waveguide 295. Furthermore, the third wavelength selective filter 53 includes the third ring resonator 73, and part of the fifth optical waveguide 295 and part of the second optical waveguide 92 that are close to the third ring resonator 73. Accordingly, the third ring resonator 73 is formed between the fifth optical waveguide 295 and the second optical waveguide 92.

Furthermore, a sixth optical waveguide 296 is formed to allow light to exit from either one to enter the other of the second end face 40b of the fourth SOA 40 and an end 296a of the sixth optical waveguide 296. Furthermore, the fourth wavelength selective filter 54 includes the fourth ring resonator 74, and part of the sixth optical waveguide 296 and part of the fourth optical waveguide 94 that are close to the fourth ring resonator 74. Accordingly, the fourth ring resonator 74 is formed between the sixth optical waveguide 296 and the fourth optical waveguide 94.

In other respects than those described above, the third embodiment may be the same as the first embodiment. Furthermore, this embodiment may be applied to the laser of the second embodiment.

[d] Fourth Embodiment

Next, a fourth embodiment is described. According to a laser of this embodiment, each of a first wavelength selective filter, a second wavelength selective filter, a third wavelength selective filter, and a fourth wavelength selective filter includes multiple ring resonators.

Figure 18:
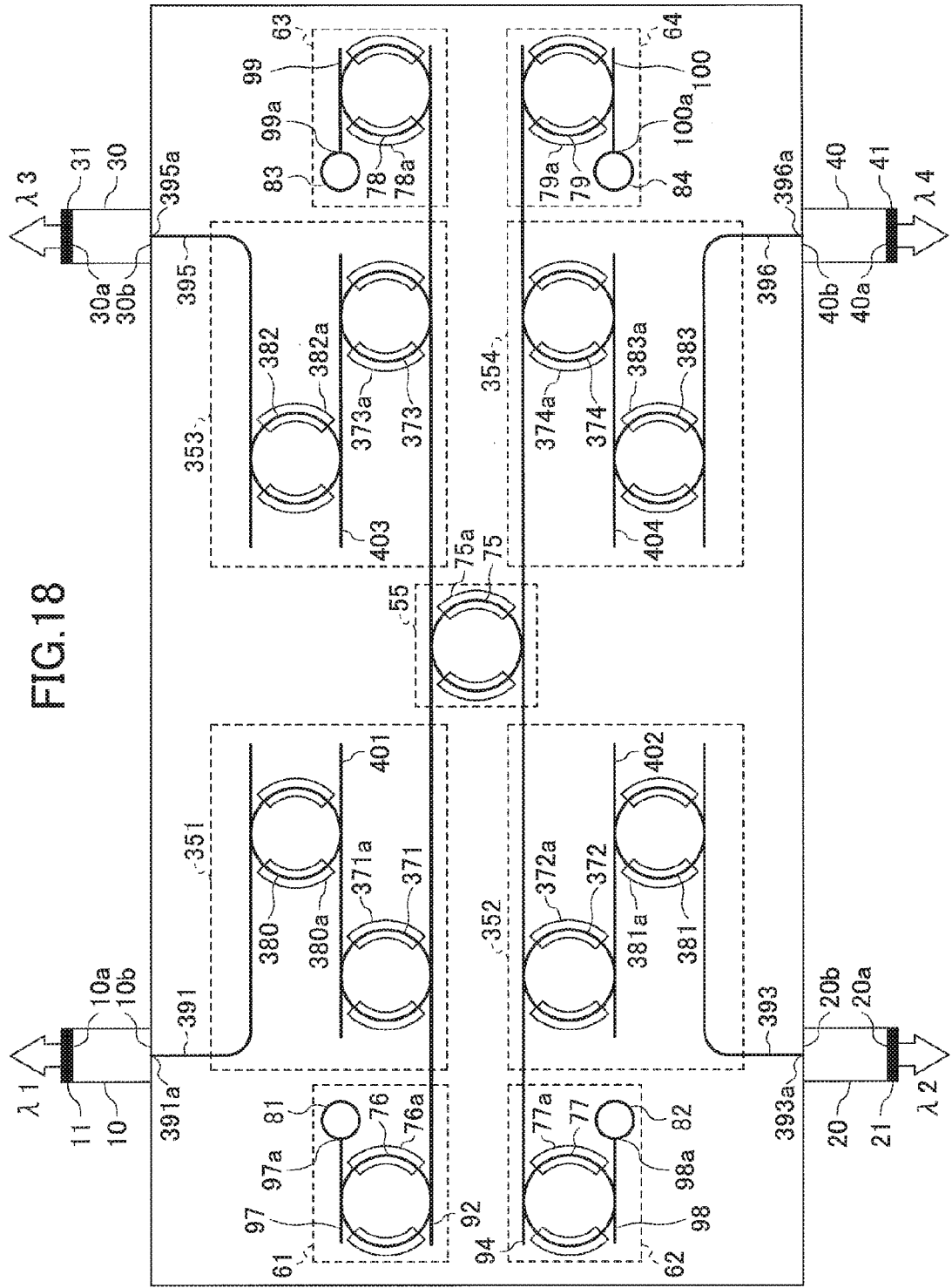
FIG. 18 is a diagram depicting a structure of a laser according to a fourth embodiment.

Referring to FIG. 18, the laser of this embodiment includes the first SOA 10, the second SOA 20, the third SOA 30, the fourth SOA 40, a first wavelength selective filter 351, a second wavelength selective filter 352, a third wavelength selective filter 353, a fourth wavelength selective filter 354, the fifth wavelength selective filter 55, the first wavelength selective mirror 61, the second wavelength selective mirror 62, the third wavelength selective mirror 63, and the fourth wavelength selective mirror 64.

According to the laser of this embodiment, a first laser beam of the wavelength $\lambda 1$ is emitted from the first end face 10a of the first SOA 10, a second laser beam of the wavelength $\lambda 2$ is emitted from the first end face 20a of the second SOA 20, a third laser beam of the wavelength $\lambda 3$ is emitted from the first end face 30a of the third SOA 30, and a fourth laser beam of the wavelength $\lambda 4$ is emitted from the first end face 40a of the fourth SOA 40.

According to this embodiment, the first wavelength selective filter 351 includes a first ring resonator 371, a tenth ring resonator 380, part of a first optical waveguide 391 close to the tenth ring resonator 380, an eleventh optical waveguide 401 close to the first ring resonator 371 and the tenth ring resonator 380, and part of the second optical waveguide 92 close to the first ring resonator 371.

Furthermore, the second wavelength selective filter 352 includes a second ring resonator 372, an eleventh ring resonator 381, part of a third optical waveguide 393 close to the eleventh ring resonator 381, a twelfth optical waveguide 402 close to the second ring resonator 372 and the eleventh ring resonator 381, and part of the fourth optical waveguide 94 close to the second ring resonator 372.

Furthermore, the third wavelength selective filter 353 includes a third ring resonator 373, a twelfth ring resonator 382, part of a fifth optical waveguide 395 close to the twelfth ring resonator 382, a thirteenth optical waveguide 403 close to the third ring resonator 373 and the twelfth ring resonator 382, and part of the second optical waveguide 92 close to the third ring resonator 373.

Furthermore, the fourth wavelength selective filter 354 includes a fourth ring resonator 374, a thirteenth ring resonator 383, part of a sixth optical waveguide 396 close to the thirteenth ring resonator 383, a fourteenth optical waveguide 404 close to the fourth ring resonator 374 and the thirteenth ring resonator 383, and part of the fourth optical waveguide 94 close to the fourth ring resonator 374.

The fifth wavelength selective filter 55 includes the fifth ring resonator 75 and part of the second optical waveguide 92 and part of the fourth optical waveguide 94 that are close to the fifth ring resonator 75.

The first ring resonator 371, the second ring resonator 372, the third ring resonator 373, the fourth ring resonator 374, the fifth ring resonator 75, the sixth ring resonator 76, the seventh ring resonator 77, the eighth ring resonator 78, the ninth ring resonator 79, the tenth ring resonator 380, the eleventh ring resonator 381, the twelfth ring resonator 382, the thirteenth ring resonator 383, the first optical waveguide 391, the second optical waveguide 92, the third optical waveguide 393, the fourth optical waveguide 94, the fifth optical waveguide 395, the sixth optical waveguide 396, the seventh optical waveguide 97, the eighth optical waveguide 98, the ninth optical waveguide 99, the tenth optical waveguide 100, the eleventh optical waveguide 401, the twelfth optical waveguide 402, the thirteenth optical waveguide 403, and the fourteenth optical waveguide 404 are formed of silicon waveguides formed on a silicon substrate.

The tenth ring resonator 380 is formed between the first optical waveguide 391 and the eleventh optical waveguide 401 to be close to the first optical waveguide 391 and the eleventh optical waveguide 401.

The first ring resonator 371 is formed between the eleventh optical waveguide 401 and the second optical waveguide 92 to be close to the eleventh optical waveguide 401 and the second optical waveguide 92.

The eleventh ring resonator 381 is formed between the third optical waveguide 393 and the twelfth optical waveguide 402 to be close to the third optical waveguide 393 and the twelfth optical waveguide 402.

The second ring resonator 372 is formed between the twelfth optical waveguide 402 and the fourth optical waveguide 94 to be close to the twelfth optical waveguide 402 and the fourth optical waveguide 94.

The twelfth ring resonator 382 is formed between the fifth optical waveguide 395 and the thirteenth optical waveguide 403 to be close to the fifth optical waveguide 395 and the thirteenth optical waveguide 403.

The third ring resonator 373 is formed between the thirteenth optical waveguide 403 and the second optical waveguide 92 to be close to the thirteenth optical waveguide 403 and the second optical waveguide 92.

The thirteenth ring resonator 383 is formed between the sixth optical waveguide 396 and the fourteenth optical waveguide 404 to be close to the sixth optical waveguide 396 and the fourteenth optical waveguide 404.

The fourth ring resonator 374 is formed between the fourteenth optical waveguide 404 and the fourth optical waveguide 94 to be close to the fourteenth optical waveguide 404 and the fourth optical waveguide 94.

The first optical waveguide 391 is formed to allow light to exit from either one to enter the other of the second end face 10b of the first SOA 10 and an end 391a of the first optical waveguide 391.

Furthermore, the third optical waveguide 393 is formed to allow light to exit from either one to enter the other of the second end face 20b of the second SOA 20 and an end 393a of the third optical waveguide 393.

Furthermore, the fifth optical waveguide 395 is formed to allow light to exit from either one to enter the other of the second end face 30b of the third SOA 30 and an end 395a of the fifth optical waveguide 395.

Furthermore, the sixth optical waveguide 396 is formed to allow light to exit from either one to enter the other of the second end face 40b of the fourth SOA 40 and an end 396a of the sixth optical waveguide 396.

According to this embodiment, the FSR of the first ring resonator 371, the second ring resonator 372, the third ring resonator 373, the fourth ring resonator 374, the tenth ring resonator 380, the eleventh ring resonator 381, the twelfth ring resonator 382, and the thirteenth ring resonator 383 is slightly different from the FSR of the fifth ring resonator 75. Furthermore, the FSR of the tenth ring resonator 380 is slightly different from the FSR of the first ring resonator 371, the FSR of the eleventh ring resonator 381 is slightly different from the FSR of the second ring resonator 372, the FSR of the twelfth ring resonator 382 is slightly different from the FSR of the third ring resonator 373, and the FSR of the thirteenth ring resonator 383 is slightly different from the FSR of the fourth ring resonator 374.

According to this embodiment, the first wavelength selective filter 351 may be equated to the first wavelength selective filter 51 of the first embodiment, the second wavelength selective filter 352 may be equated to the second wavelength selective filter 52 of the first embodiment, the third wavelength selective filter 353 may be equated to the third wavelength selective filter 53 of the first embodiment, and the fourth wavelength selective filter 354 may be equated to the fourth wavelength selective filter 54 of the first embodiment. That is, according to the laser of this embodiment, each of the first wavelength selective filter 351, the second wavelength selective filter 352, the third wavelength selective filter 353, and the fourth wavelength selective filter 354 includes multiple ring resonators.

According to this embodiment, for example, the fifth ring resonator 75 is formed with a radius of approximately 475 μm to have an FSR of 25 GHz. Furthermore, the first ring resonator 371, the second ring resonator 372, the third ring resonator 373, and the fourth ring resonator 374 are formed with a radius of approximately 500 μm to have an FSR of 23.75 GHz. Furthermore, the tenth ring resonator 380, the eleventh ring resonator 381, the twelfth ring resonator 382, and the thirteenth ring resonator 383 are formed with a radius of approximately 525 μm to have an FSR of 22.5 GHz.

Figure 19A:
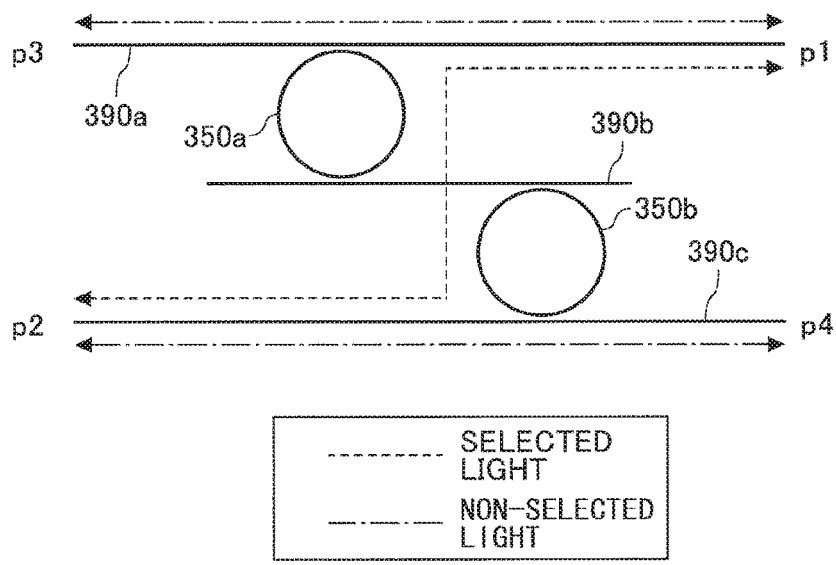
FIGS. 19A through 19C are diagrams illustrating a wavelength selective filter according to the fourth embodiment.

Next, a wavelength selective filter using ring resonators employed in the laser according to this embodiment is described with reference to FIGS. 19A through 19C. Referring to FIG. 19A, the wavelength selective filter includes a ring resonator 350a, a ring resonator 350b, and optical waveguides 390a, 390b, and 390c that are provided close to one or both of the ring resonators 350a and 350b. Specifically, the ring resonator 350a is formed between the optical waveguide 390a and the optical waveguide 390b to be close to the optical waveguide 390a and the optical waveguide 390b. Furthermore, the ring resonator 350b is formed between the optical waveguide 390b and the optical waveguide 390c to be close to the optical waveguide 390b and the optical waveguide 390c. For convenience of description, a first end and a second end of the optical waveguide 390a are referred to as "port p1" and "port p3," respectively, and a first end and a second end of the optical waveguide 390c are referred to as "port p4" and "port p2," respectively, in the following description of the wavelength selective filter.

Of light entering the port p1 of the optical waveguide 390a, light of the resonant wavelengths of the ring resonator 350a propagates to the optical waveguide 390b through the ring resonator 350a. Of the light propagating to the optical waveguide 390b, light of the resonant wavelengths of the ring resonator 350b propagates to the optical waveguide 390c through the ring resonator 350b to exit from the port p2. Furthermore, light other than the light of the resonant wavelengths of the ring resonator 350a directly propagates through the optical waveguide 390a to exit from the port p3.

Likewise, of light entering the port p2 of the optical waveguide 390c, light of the resonant wavelengths of the ring resonator 350b propagates to the optical waveguide 390b through the ring resonator 350b. Of the light propagating to the optical waveguide 390b, light of the resonant wavelengths of the ring resonator 350a propagates to the optical waveguide 390a through the ring resonator 350a to exit from the port p1. Furthermore, light other than the light of the resonant wavelengths of the ring resonator 350b directly propagates through the optical waveguide 390c to exit from the port p4.

In FIG. 19A, light of a resonant wavelength that propagates from one to the other of the optical waveguide 390a and the optical waveguide 390c through the ring resonator 350a, the optical waveguide 390b, and the ring resonator 350b is indicated by a dashed line as selected light. Furthermore, light other than the light of a resonant wavelength that propagates through the optical waveguide 390a or 390c without propagating to the ring resonator 350a or 350b is indicated by a one-dot chain line as non-selected light.

Figure 19B:
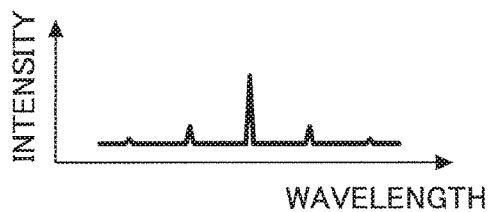
Figure 19C:
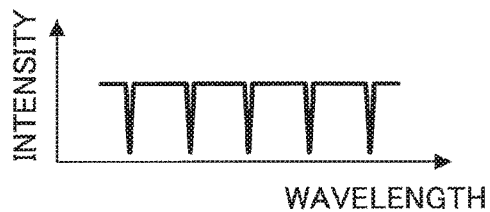

A spectrum of light that is the selected light of the wavelength selective filter depicted in FIG. 19A is presented in FIG. 19B, and a spectrum of through light that is the non-selected light of the wavelength selective filter depicted in FIG. 19A is presented in FIG. 19C. As exhibited in FIG. 19B, the wavelength selective filter depicted in FIG. 19A can select only a wavelength at which a resonant wavelength of the ring resonator 350a and a resonant wavelength of the ring resonator 350b match.

According to the laser of this embodiment, the first wavelength selective filter 351, the second wavelength selective filter 352, the third wavelength selective filter 353, and the fourth wavelength selective filter 354 have the same structure as the wavelength selective filter depicted in FIG. 19A.

According to this embodiment as well, a first laser resonator that emits the first laser beam is formed between the partially reflecting mirror 11 formed at or on the first end face 10a of the first SOA 10 and the second wavelength selective mirror 62, using the first SOA 10 as a first gain medium. Furthermore, a second laser resonator that emits the second laser beam is formed between the partially reflecting mirror 21 formed at or on the first end face 20a of the second SOA 20 and the first wavelength selective mirror 61, using the second SOA 20 as a second gain medium. Furthermore, a third laser resonator that emits the third laser beam is formed between the partially reflecting mirror 31 formed at or on the first end face 30a of the third SOA 30 and the fourth wavelength selective mirror 64, using the third SOA 30 as a third gain medium. Furthermore, a fourth laser resonator that emits the fourth laser beam is formed between the partially reflecting mirror 41 formed at or on the first end face 40a of the fourth SOA 40 and the third wavelength selective mirror 63, using the fourth SOA 40 as a fourth gain medium. As a result, it is possible to emit four laser beams of wavelengths different from one another independent of one another.

According to this embodiment, the first ring resonator 371 and the seventh ring resonator 77 are formed with substantially the same radius to have the same resonant wavelengths, and the second ring resonator 372 and the sixth ring resonator 76 are formed with substantially the same radius to have the same resonant wavelengths. Furthermore, the third ring resonator 373 and the ninth ring resonator 79 are formed with substantially the same radius to have the same resonant wavelengths, and the fourth ring resonator 374 and the eighth ring resonator 78 are formed with substantially the same radius to have the same resonant wavelengths.

In the optical path of the first laser resonator, the tenth ring resonator 380, the first ring resonator 371, and the fifth ring resonator 75, whose FSRs are slightly different from one another, are provided, and laser oscillation occurs at the wavelength $\lambda 1$, at which resonant wavelengths of these three ring resonators 380, 371, and 75 match, because of the Vernier effect. In the optical path of the second laser resonator, the eleventh ring resonator 381, the second ring resonator 372, and the fifth ring resonator 75, whose FSRs are slightly different from one another, are provided, and laser oscillation occurs at the wavelength $\lambda 2$, at which resonant wavelengths of these three ring resonators 381, 372, and 75 match, because of the Vernier effect. In the optical path of the third laser resonator, the twelfth ring resonator 382, the third ring resonator 373, and the fifth ring resonator 75, whose FSRs are slightly different from one another, are provided, and laser oscillation occurs at the wavelength $\lambda 3$, at which resonant wavelengths of these three ring resonators 382, 373, and 75 match, because of the Vernier effect. In the optical path of the fourth laser resonator, the thirteenth ring resonator 383, the fourth ring resonator 374, and the fifth ring resonator 75, whose FSRs are slightly different from one another, are provided, and laser oscillation occurs at the wavelength $\lambda 4$, at which resonant wavelengths of these three ring resonators 383, 374, and 75 match, because of the Vernier effect.

According to this embodiment, compared with the first embodiment according to which an oscillation wavelength is selected with two ring resonators, an oscillation wavelength is selected with three ring resonators. Therefore, it is possible to more sharply select a single wavelength, thus facilitating single-mode oscillation.

That is, the first wavelength selective filter 351 including the tenth ring resonator 380 and the first ring resonator 371 is a wavelength selective filter where a substantially single wavelength is selected as a selected wavelength because of the Vernier effect of two ring resonators. Furthermore, of the selected wavelengths of the first wavelength selective filter 351, a wavelength that coincides with one of the periodic resonant wavelengths of the fifth ring resonator 75 is selected. Accordingly, it is possible to more sharply select a single wavelength.

Likewise, the second wavelength selective filter 352 including the eleventh ring resonator 381 and the second ring resonator 372 is a wavelength selective filter where a substantially single wavelength is selected as a selected wavelength because of the Vernier effect of two ring resonators. Furthermore, of the selected wavelengths of the second wavelength selective filter 352, a wavelength that coincides with one of the periodic resonant wavelengths of the fifth ring resonator 75 is selected. Accordingly, it is possible to more sharply select a single wavelength.

Furthermore, the third wavelength selective filter 353 including the twelfth ring resonator 382 and the third ring resonator 373 is a wavelength selective filter where a substantially single wavelength is selected as a selected wavelength because of the Vernier effect of two ring resonators. Furthermore, of the selected wavelengths of the third wavelength selective filter 353, a wavelength that coincides with one of the periodic resonant wavelengths of the fifth ring resonator 75 is selected. Accordingly, it is possible to more sharply select a single wavelength.

Furthermore, the fourth wavelength selective filter 354 including the thirteenth ring resonator 383 and the fourth ring resonator 374 is a wavelength selective filter where a substantially single wavelength is selected as a selected wavelength because of the Vernier effect of two ring resonators. Furthermore, of the selected wavelengths of the fourth wavelength selective filter 354, a wavelength that coincides with one of the periodic resonant wavelengths of the fifth ring resonator 75 is selected. Accordingly, it is possible to more sharply select a single wavelength.

Furthermore, the wavelength $\lambda 1$, which is the oscillation wavelength of the first laser resonator, is different from the resonant wavelengths of the second ring resonator 372. Therefore, the wavelength $\lambda 1$ does not become drop light in the second ring resonator 372, and accordingly, does not arrive at the second SOA 20. Furthermore, according to this embodiment, there is another stage of wavelength selection in the eleventh ring resonator 381 between the second ring resonator 372 and the second SOA 20. Therefore, light exiting from the first SOA 10 is more unlikely to arrive at the second SOA 20.

Likewise, the wavelength $\lambda 2$, which is the oscillation wavelength of the second laser resonator, is different from the resonant wavelengths of the first ring resonator 371. Therefore, the wavelength $\lambda 2$ does not become drop light in the first ring resonator 371, and accordingly, does not arrive at the first SOA 10. Furthermore, according to this embodiment, there is another stage of wavelength selection in the tenth ring resonator 380 between the first ring resonator 371 and the first SOA 10. Therefore, light exiting from the second SOA 20 is more unlikely to arrive at the first SOA 10.

The wavelength $\lambda 3$, which is the oscillation wavelength of the third laser resonator, is different from the resonant wavelengths of the fourth ring resonator 374. Therefore, the wavelength $\lambda 3$ does not become drop light in the fourth ring resonator 374, and accordingly, does not arrive at the fourth SOA 40. Furthermore, according to this embodiment, there is another stage of wavelength selection in the thirteenth ring resonator 383 between the fourth ring resonator 374 and the fourth SOA 40. Therefore, light exiting from the third SOA 30 is more unlikely to arrive at the fourth SOA 40.

The wavelength $\lambda 4$, which is the oscillation wavelength of the fourth laser resonator, is different from the resonant wavelengths of the third ring resonator 373. Therefore, the wavelength $\lambda 4$ does not become drop light in the third ring resonator 373, and accordingly, does not arrive at the third SOA 30. Furthermore, according to this embodiment, there is another stage of wavelength selection in the twelfth ring resonator 382 between the third ring resonator 373 and the third SOA 30. Therefore, light exiting from the fourth SOA 40 is more unlikely to arrive at the third SOA 30.

Thus, according to the laser of this embodiment, it is possible to cause the first laser resonator, the second laser resonator, the third laser resonator, and the fourth laser resonator to be more independent of one another with respect to laser oscillation.

According to this embodiment, each of the first wavelength selective filter 351, the second wavelength selective filter 352, the third wavelength selective filter 353, and the fourth wavelength selective filter 354 is a wavelength selective filter that selects a single wavelength by combining two ring resonators. The above-described embodiment, however, is not limited to this configuration. For example, a wavelength selective filter including four input/output ports p1 through p4 and having characteristics such that selected light of a single wavelength propagates between p1 and p2 and part of non-selected light other than the selected light propagates between p1 and p3 or between p2 and p4 can produce the same effects.

According to the laser of this embodiment, a filter configured to select substantially a single wavelength is employed for each of the first wavelength selective filter 351, the second wavelength selective filter 352, the third wavelength selective filter 353, and the fourth wavelength selective filter 354. Therefore, the selected wavelength of the first wavelength selective filter 351 is substantially only the oscillation wavelength of the first laser resonator, and the selected wavelength of the second wavelength selective filter 352 is substantially only the oscillation wavelength of the second laser resonator. Furthermore, the selected wavelength of the third wavelength selective filter 353 is substantially only the oscillation wavelength of the third laser resonator, and the selected wavelength of the fourth wavelength selective filter 354 is substantially only the oscillation wavelength of the fourth laser resonator. Accordingly, compared with the case of employing a wavelength selective filter having multiple resonant wavelengths, it is possible to prevent propagation of light of an extra wavelength other than the selected wavelength. This makes it easier for the first laser resonator, the second laser resonator, the third laser resonator, and the fourth laser resonator to operate more independent of one another.

In other respects than those described above, the fourth embodiment may be the same as the first embodiment. For example, as depicted in FIG. 18, heater electrodes 371a are formed on a ring part of the first ring resonator 371, heater electrodes 372a are formed on a ring part of the second ring resonator 372, and heater electrodes 373a are formed on a ring part of the third ring resonator 373, and heater electrodes 374a are formed on a ring part of the fourth ring resonator 374. Furthermore, heater electrodes 380a are formed on a ring part of the tenth ring resonator 380, heater electrodes 381a are formed on a ring part of the eleventh ring resonator 381, heater electrodes 382a are formed on a ring part of the twelfth ring resonator 382, and heater electrodes 383a are formed on a ring part of the thirteenth ring resonator 383.

[e] Fifth Embodiment

Figure 20:
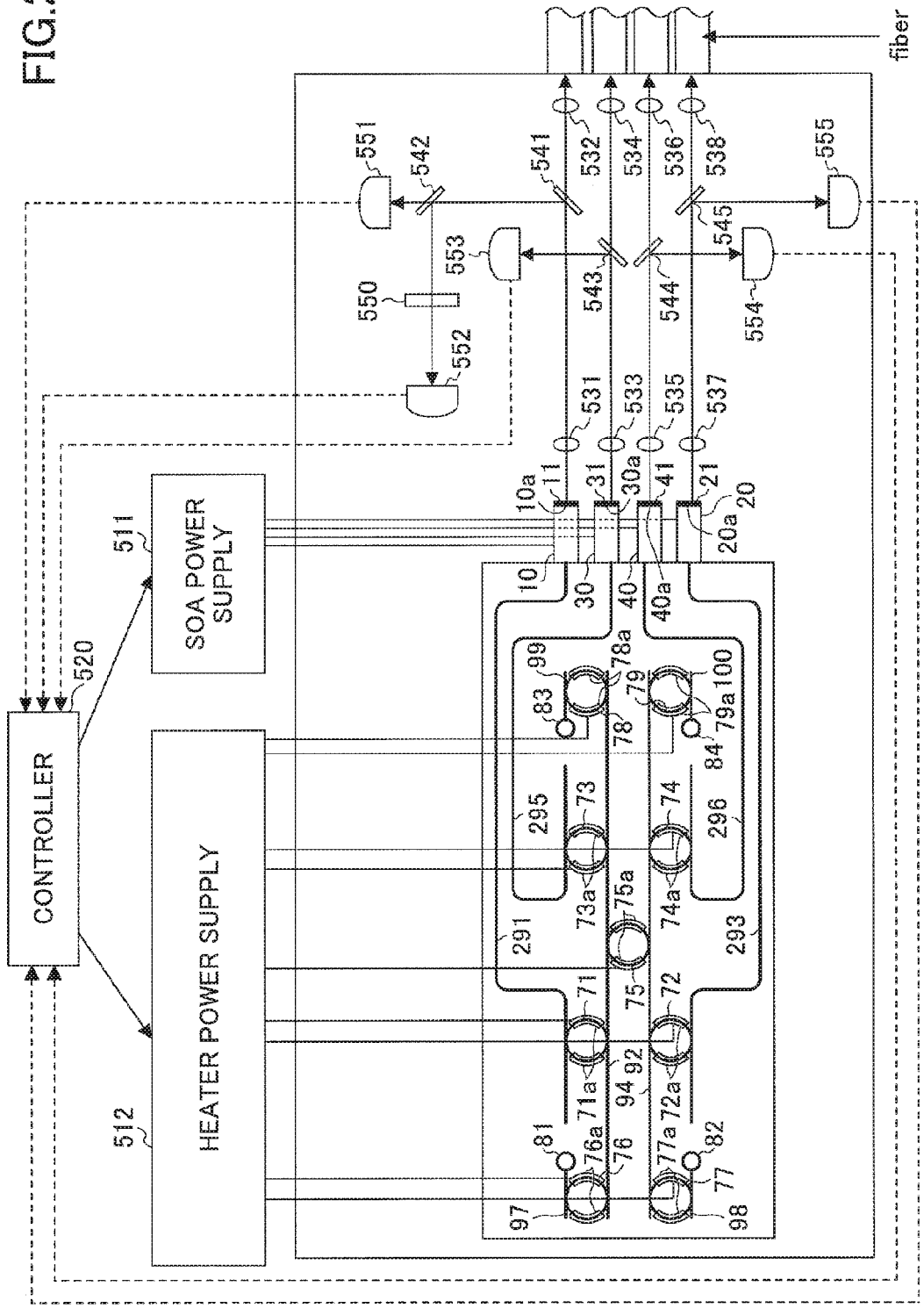
FIG. 20 is a diagram depicting a structure of a laser module according to a fifth embodiment.

Next, a fifth embodiment is described. A laser module according to this embodiment is a tunable laser module, and includes the laser of the third embodiment. Specifically, referring to FIG. 20, the laser of this embodiment includes the laser of the third embodiment, an SOA power supply 511, a heater power supply 512, and a controller 520.

The SOA power supply 511 is a power supply for driving the first SOA 10, the second SOA 20, the third SOA 30, and the fourth SOA 40.

The heater power supply 512 is connected to the heater electrodes 71a of the first ring resonator 71, the heater electrodes 72a of the second ring resonator 72, the heater electrodes 73a of the third ring resonator 73, the heater electrodes 74a of the fourth ring resonator 74, the heater electrodes 75a of the fifth ring resonator 75, the heater electrodes 76a of the sixth ring resonator 76, the heater electrodes 77a of the seventh ring resonator 77, the heater electrodes 78a of the eighth ring resonator 78, and the heater electrodes 79a of the ninth ring resonator 79.

Accordingly, by causing an electric current to flow from the heater power supply 512 to the heater electrodes 71a and thereby heating the first ring resonator 71, it is possible to minutely change and adjust the resonant wavelengths of the first ring resonator 71. Furthermore, by causing an electric current to flow from the heater power supply 512 to the heater electrodes 72a and thereby heating the second ring resonator 72, it is possible to minutely change and adjust the resonant wavelengths of the second ring resonator 72. By causing an electric current to flow from the heater power supply 512 to the heater electrodes 73a and thereby heating the third ring resonator 73, it is possible to minutely change and adjust the resonant wavelengths of the third ring resonator 73. By causing an electric current to flow from the heater power supply 512 to the heater electrodes 74a and thereby heating the fourth ring resonator 74, it is possible to minutely change and adjust the resonant wavelengths of the fourth ring resonator 74. By causing an electric current to flow from the heater power supply 512 to the heater electrodes 75a and thereby heating the fifth ring resonator 75, it is possible to minutely change and adjust the resonant wavelengths of the fifth ring resonator 75. By causing an electric current to flow from the heater power supply 512 to the heater electrodes 76a and thereby heating the sixth ring resonator 76, it is possible to minutely change and adjust the resonant wavelengths of the sixth ring resonator 76. By causing an electric current to flow from the heater power supply 512 to the heater electrodes 77a and thereby heating the seventh ring resonator 77, it is possible to minutely change and adjust the resonant wavelengths of the seventh ring resonator 77. By causing an electric current to flow from the heater power supply 512 to the heater electrodes 78a and thereby heating the eighth ring resonator 78, it is possible to minutely change and adjust the resonant wavelengths of the eighth ring resonator 78. By causing an electric current to flow from the heater power supply 512 to the heater electrodes 79a and thereby heating the ninth ring resonator 79, it is possible to minutely change and adjust the resonant wavelengths of the ninth ring resonator 79.

The controller 520, which serves as a control part, is connected to and controls the SOA power supply 511 and the heater power supply 512.

The laser module according to this embodiment includes lenses 531, 532, 533, 534, 535, 536, 537, and 538, a first beam splitter 541, a second beam splitter 542, a third beam splitter 543, a fourth beam splitter 544, a fifth beam splitter 545, an etalon 550, a first optical detector 551, a second optical detector 552, a third optical detector 553, a fourth optical detector 554, and a fifth optical detector 555. Each of the first optical detector 551, the second optical detector 552, the third optical detector 553, the fourth optical detector 554, and the fifth optical detector 555 is formed of, for example, a photodiode.

A first laser beam emitted from the first end face 10a of the first SOA 10 is made incident on the first beam splitter 541 through the lens 531 to be split into a transmitted laser beam and a reflected laser beam in a ratio of, for example, 10:1 by the first beam splitter 541. The laser beam reflected from the first beam splitter 541 is made incident on the second beam splitter 542 to be split into a transmitted laser beam and a reflected laser beam in a ratio of, for example, 1:1 by the second beam splitter 542. The laser beam transmitted through the second beam splitter 542 enters the first optical detector 551 to have its amount of light detected. Of the laser beam reflected from the second beam splitter 542, a light beam transmitted through the etalon 550 enters the second optical detector 552 to have its amount of light detected.

The etalon 550 is a wavelength locker etalon whose FSR is 50 GHz, and has a transmission characteristic close to a sine wave with respect to light of predetermined wavelengths. Each peak wavelength of light transmitted through the etalon 550 coincides with the center of two grids of an ITU-T grid of an interval of 25 GHz. That is, an ITU-T grid of 25 GHz is formed to match each middle point between a top peak and a bottom peak of the transmitted light of the etalon 550.

According to the laser of this embodiment, it is possible to emit the first laser beam of desired intensity by controlling the electric current of the first SOA 10 based on the value detected in the first optical detector 551. Furthermore, electric currents flowing to the heater electrodes 71a of the first ring resonator 71, the heater electrodes 75a of the fifth ring resonator 75, and the heater electrodes 77a of the seventh ring resonator 77 are controlled to cause the ratio of the values detected in the second optical detector 552 and the first optical detector 551 (a value corresponding to the transmittance of the etalon 550) to be a desired value. As a result, the wavelength λ1, at which resonant wavelengths of the first ring resonator 71, the fifth ring resonator 75, and the seventh ring resonator 77 match, can be controlled to a desired wavelength, and the oscillation wavelength of the first laser beam can be a desired wavelength. The first laser beam transmitted through the first beam splitter 541 is emitted to, for example, an optical fiber through the lens 532.

A second laser beam emitted from the first end face 20a of the second SOA 20 is made incident on the third beam splitter 543 through the lens 533 to be split into a transmitted laser beam and a reflected laser beam in a ratio of, for example, 10:1 by the third beam splitter 543. The laser beam reflected from the third beam splitter 543 enters the third optical detector 553 to have its amount of light detected. The second laser beam transmitted through the third beam splitter 543 is emitted to, for example, an optical fiber through the lens 534.

According to the laser of this embodiment, it is possible to emit the second laser beam of desired intensity by controlling the electric current of the second SOA 20 based on the value detected in the third optical detector 553. Furthermore, the same as in the case of the first laser beam, the oscillation wavelength of the second laser beam coincides with one of the resonant wavelengths of the fifth ring resonator 75. Accordingly, when the FSR of the fifth ring resonator 75 is 25 GHz, by matching the oscillation wavelength of the first laser beam with a grid wavelength of an ITU-T grid of an interval of 25 GHz, the oscillation wavelength of the second laser beam also can be automatically matched with a grid wavelength of the ITU-T grid of an interval of 25 GHz.

With respect to the oscillation wavelength of the second laser beam, it is possible to vary a wavelength at which resonant wavelengths of the second ring resonator 72, the fifth ring resonator 75, and the sixth ring resonator 76 match by controlling an electric current flowing to the heater electrodes 72a of the second ring resonator 72 and an electric current flowing to the heater electrodes 76a of the sixth ring resonator 76. For example, it is possible to set the oscillation wavelength of the second laser beam to any wavelength that is apart from the oscillation wavelength of the first laser beam by an integral multiple of 25 GHz, such as 25 GHz, 50 GHz, 75 GHz, and 100 GHz.

A third laser beam emitted from the first end face 30a of the third SOA 30 is made incident on the fourth beam splitter 544 through the lens 535 to be split into a transmitted laser beam and a reflected laser beam in a ratio of, for example, 10:1 by the fourth beam splitter 544. The laser beam reflected from the fourth beam splitter 544 enters the fourth optical detector 554 to have its amount of light detected. The third laser beam transmitted through the fourth beam splitter 544 is emitted to, for example, an optical fiber through the lens 536.

According to the laser of this embodiment, it is possible to emit the third laser beam of desired intensity by controlling the electric current of the third SOA 30 based on the value detected in the fourth optical detector 554. Furthermore, the same as in the case of the first laser beam, the oscillation wavelength of the third laser beam coincides with one of the resonant wavelengths of the fifth ring resonator 75. Accordingly, when the FSR of the fifth ring resonator 75 is 25 GHz, by matching the oscillation wavelength of the first laser beam with a grid wavelength of an ITU-T grid of an interval of 25 GHz, the oscillation wavelength of the third laser beam also can be automatically matched with a grid wavelength of the ITU-T grid of an interval of 25 GHz.

With respect to the oscillation wavelength of the third laser beam, it is possible to vary a wavelength at which resonant wavelengths of the third ring resonator 73, the fifth ring resonator 75, and the ninth ring resonator 79 match by controlling an electric current flowing to the heater electrodes 73a of the third ring resonator 73 and an electric current flowing to the heater electrodes 79a of the ninth ring resonator 79. For example, it is possible to set the oscillation wavelength of the third laser beam to any wavelength that is apart from the oscillation wavelength of the first laser beam by an integral multiple of 25 GHz, such as 25 GHz, 50 GHz, 75 GHz, and 100 GHz.

A fourth laser beam emitted from the first end face 40a of the fourth SOA 40 is made incident on the fifth beam splitter 545 through the lens 537 to be split into a transmitted laser beam and a reflected laser beam in a ratio of, for example, 10:1 by the fifth beam splitter 545. The laser beam reflected from the fifth beam splitter 545 enters the fifth optical detector 555 to have its amount of light detected. The fourth laser beam transmitted through the fifth beam splitter 545 is emitted to, for example, an optical fiber through the lens 538.

According to the laser of this embodiment, it is possible to emit the fourth laser beam of desired intensity by controlling the electric current of the fourth SOA 40 based on the value detected in the fifth optical detector 555. Furthermore, the same as in the case of the first laser beam, the oscillation wavelength of the fourth laser beam coincides with one of the resonant wavelengths of the fifth ring resonator 75. Accordingly, when the FSR of the fifth ring resonator 75 is 25 GHz, by matching the oscillation wavelength of the first laser beam with a grid wavelength of an ITU-T grid of an interval of 25 GHz, the oscillation wavelength of the fourth laser beam also can be automatically matched with a grid wavelength of the ITU-T grid of an interval of 25 GHz.

With respect to the oscillation wavelength of the fourth laser beam, it is possible to vary a wavelength at which resonant wavelengths of the fourth ring resonator 74, the fifth ring resonator 75, and the eighth ring resonator 78 match by controlling an electric current flowing to the heater electrodes 74a of the fourth ring resonator 74 and an electric current flowing to the heater electrodes 78a of the eighth ring resonator 78. For example, it is possible to set the oscillation wavelength of the fourth laser beam to any wavelength that is apart from the oscillation wavelength of the first laser beam by an integral multiple of 25 GHz, such as 25 GHz, 50 GHz, 75 GHz, and 100 GHz.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:

1. A laser, comprising:
a first gain medium;
a first partially reflecting mirror provided at a first end face of the first gain medium;
a second gain medium;
a second partially reflecting mirror provided at a first end face of the second gain medium;
a third gain medium;
a third partially reflecting mirror provided at a first end face of the third gain medium;
a fourth gain medium;
a fourth partially reflecting mirror provided at a first end face of the fourth gain medium;
a first wavelength selective filter;
a second wavelength selective filter;
a third wavelength selective filter;
a fourth wavelength selective filter;
a fifth wavelength selective filter;
a first wavelength selective mirror;
a second wavelength selective mirror;
a third wavelength selective mirror; and
a fourth wavelength selective mirror;
wherein
each of the first wavelength selective filter, the second wavelength selective filter, the third wavelength selective filter, the fourth wavelength selective filter, and the fifth wavelength selective filter includes a first input/output port, a second input/output port, a third input/output port, and a fourth input/output port, where the first input/output port and the second input/output port are connected and the third input/output port and the fourth input/output port are connected with respect to selected light that is selected wavelengths, and the first input/output port and the third input/output port are connected and the second input/output port and the fourth input/output port are connected with respect to non-selected light, the fifth wavelength selective filter is configured to select lights of periodic wavelengths,
the first input/output port of the first wavelength selective filter is connected to a second end face of the first gain medium,
the first input/output port of the second wavelength selective filter is connected to a second end face of the second gain medium,
the first input/output port of the third wavelength selective filter is connected to a second end face of the third gain medium,
the first input/output port of the fourth wavelength selective filter is connected to a second end face of the fourth gain medium,
the first wavelength selective mirror is connected to the fourth input/output port of the first wavelength selective filter,
the second wavelength selective mirror is connected to the fourth input/output port of the second wavelength selective filter,
the third wavelength selective mirror is connected to the fourth input/output port of the third wavelength selective filter,
the fourth wavelength selective mirror is connected to the fourth input/output port of the fourth wavelength selective filter,
the second input/output port of the first wavelength selective filter is connected to the first input/output port of the fifth wavelength selective filter,
the second input/output port of the second wavelength selective filter is connected to the second input/output port of the fifth wavelength selective filter,
the second input/output port of the third wavelength selective filter is connected to the third input/output port of the fifth wavelength selective filter, and
the second input/output port of the fourth wavelength selective filter is connected to the fourth input/output port of the fifth wavelength selective filter.

2. The laser as claimed in claim 1, wherein
first wavelengths of the selected light of the first wavelength selective filter, second wavelengths of the selected light of the second wavelength selective filter, third wavelengths of the selected light of the third wavelength selective filter, and fourth wavelengths of the selected light of the fourth wavelength selective filter are different from one another,
the first wavelengths are equal to wavelengths reflected from the second wavelength selective mirror,
the second wavelengths are equal to wavelengths reflected from the first wavelength selective mirror,
the third wavelengths are equal to wavelengths reflected from the fourth wavelength selective mirror, and
the fourth wavelengths are equal to wavelengths reflected from the third wavelength selective mirror.

3. The laser as claimed in claim 1, wherein
the first wavelength selective mirror includes a first ring resonator and a total reflection mirror, and is configured to reflect light of resonant wavelengths of the first ring resonator,
the second wavelength selective mirror includes a second ring resonator and a total reflection mirror, and is configured to reflect light of resonant wavelengths of the second ring resonator,
the third wavelength selective mirror includes a third ring resonator and a total reflection mirror, and is configured to reflect light of resonant wavelengths of the third ring resonator, and the fourth wavelength selective mirror includes a fourth ring resonator and a total reflection mirror, and is configured to reflect light of resonant wavelengths of the fourth ring resonator.

4. The laser as claimed in claim 1, wherein
the first wavelength selective filter includes a first ring resonator, and is configured to select light of resonant wavelengths of the first ring resonator,
the second wavelength selective filter includes a second ring resonator, and is configured to select light of resonant wavelengths of the second ring resonator,
the third wavelength selective filter includes a third ring resonator, and is configured to select light of resonant wavelengths of the third ring resonator,
the fourth wavelength selective filter includes a fourth ring resonator, and is configured to select light of resonant wavelengths of the fourth ring resonator, and
the fifth wavelength selective filter includes a fifth ring resonator, and is configured to select light of resonant wavelengths of the fifth ring resonator.

5. The laser as claimed in claim 4, wherein an interval of the resonant wavelengths of each of the first ring resonator, the second ring resonator, the third ring resonator, and the fourth ring resonator is different from an interval of the resonant wavelengths of the fifth ring resonator.

6. The laser as claimed in claim 4, wherein
the first wavelength selective mirror includes a sixth ring resonator and a total reflection mirror, and is configured to reflect light of resonant wavelengths of the sixth ring resonator,
the second wavelength selective mirror includes a seventh ring resonator and a total reflection mirror, and is configured to reflect light of resonant wavelengths of the seventh ring resonator,
the third wavelength selective mirror includes an eighth ring resonator and a total reflection mirror, and is configured to reflect light of resonant wavelengths of the eighth ring resonator, and
the fourth wavelength selective mirror includes a ninth ring resonator and a total reflection mirror, and is configured to reflect light of resonant wavelengths of the ninth ring resonator.

7. The laser as claimed in claim 6, wherein the resonant wavelengths of each of the first ring resonator, the second ring resonator, the third ring resonator, the fourth ring resonator, the fifth ring resonator, the sixth ring resonator, the seventh ring resonator, the eighth ring resonator, and the ninth ring resonator are variable.

8. The laser as claimed in claim 4, wherein
a full width at half maximum of the resonant wavelengths of the first ring resonator is less than or equal to a difference between an interval of the resonant wavelengths of the first ring resonator and an interval of the resonant wavelengths of the fifth ring resonator,
a full width at half maximum of the resonant wavelengths of the second ring resonator is less than or equal to a difference between an interval of the resonant wavelengths of the second ring resonator and an interval of the resonant wavelengths of the fifth ring resonator,
a full width at half maximum of the resonant wavelengths of the third ring resonator is less than or equal to a difference between an interval of the resonant wavelengths of the third ring resonator and an interval of the resonant wavelengths of the fifth ring resonator, and
a full width at half maximum of the resonant wavelengths of the fourth ring resonator is less than or equal to a difference between an interval of the resonant wavelengths of the fourth ring resonator and an interval of the resonant wavelengths of the fifth ring resonator.

9. The laser as claimed in claim 4, wherein an interval of the resonant wavelengths of each of the first ring resonator, the second ring resonator, the third ring resonator, and the fourth ring resonator is minutely different from n times an interval of the resonant wavelengths of the fifth ring resonator, where n is an integer greater than or equal to two.

10. The laser as claimed in claim 4, wherein the first ring resonator, the second ring resonator, the third ring resonator, the fourth ring resonator, and the fifth ring resonator are formed of silicon waveguides.

11. The laser as claimed in claim 1, wherein
a wavelength at which a wavelength of the selected light of the first wavelength selective filter and a wavelength of the selected light of the fifth wavelength selective filter match is different from wavelengths of the selected light of each of the second wavelength selective filter and the third wavelength selective filter, and is reflected from the second wavelength selective mirror and is not reflected from the third wavelength selective mirror,
a wavelength at which a wavelength of the selected light of the second wavelength selective filter and a wavelength of the selected light of the fifth wavelength selective filter match is different from wavelengths of the selected light of each of the first wavelength selective filter and the fourth wavelength selective filter, and is reflected from the first wavelength selective mirror and is not reflected from the fourth wavelength selective mirror,
a wavelength at which a wavelength of the selected light of the third wavelength selective filter and a wavelength of the selected light of the fifth wavelength selective filter match is different from wavelengths of the selected light of each of the first wavelength selective filter and the fourth wavelength selective filter, and is reflected from the fourth wavelength selective mirror and is not reflected from the first wavelength selective mirror, and
a wavelength at which a wavelength of the selected light of the fourth wavelength selective filter and a wavelength of the selected light of the fifth wavelength selective filter match is different from wavelengths of the selected light of each of the second wavelength selective filter and the third wavelength selective filter, and is reflected from the third wavelength selective mirror and is not reflected from the second wavelength selective mirror.

12. The laser as claimed in claim 1, wherein each of the first wavelength selective filter, the second wavelength selective filter, the third wavelength selective filter, and the fourth wavelength selective filter includes a plurality of ring resonators having different intervals of resonant wavelengths.

13. A laser, comprising:
a first gain medium;
a first partially reflecting mirror provided at a first end face of the first gain medium;
a second gain medium;
a second partially reflecting mirror provided at a first end face of the second gain medium;
a third gain medium;
a third partially reflecting mirror provided at a first end face of the third gain medium;
a fourth gain medium;

a fourth partially reflecting mirror provided at a first end face of the fourth gain medium;
a first wavelength selective filter;
a second wavelength selective filter;
a third wavelength selective filter;
a fourth wavelength selective filter;
a fifth wavelength selective filter;
a first wavelength selective mirror;
a second wavelength selective mirror;
a third wavelength selective mirror; and
a fourth wavelength selective mirror;
wherein
a resonator including the first gain medium, the first wavelength selective filter, and the fifth wavelength selective filter is formed in an optical path between the first partially reflecting mirror and the second wavelength selective mirror, and of light exiting from a second end face of the first gain medium, light of a wavelength selected in the first wavelength selective filter and the fifth wavelength selective filter is emitted from the first end face of the first gain medium as a first laser beam,
a resonator including the second gain medium, the second wavelength selective filter, and the fifth wavelength selective filter is formed in an optical path between the second partially reflecting mirror and the first wavelength selective mirror, and of light exiting from a second end face of the second gain medium, light of a wavelength selected in the second wavelength selective filter and the fifth wavelength selective filter is emitted from the first end face of the second gain medium as a second laser beam,
a resonator including the third gain medium, the third wavelength selective filter, and the fifth wavelength selective filter is formed in an optical path between the third partially reflecting mirror and the fourth wavelength selective mirror, and of light exiting from a second end face of the third gain medium, light of a wavelength selected in the third wavelength selective filter and the fifth wavelength selective filter is emitted from the first end face of the third gain medium as a third laser beam,
a resonator including the fourth gain medium, the fourth wavelength selective filter, and the fifth wavelength selective filter is formed in an optical path between the fourth partially reflecting mirror and the third wavelength selective mirror, and of light exiting from a second end face of the fourth gain medium, light of a wavelength selected in the fourth wavelength selective filter and the fifth wavelength selective filter is emitted from the first end face of the fourth gain medium as a fourth laser beam, and
the wavelength of the first laser beam, the wavelength of the second laser beam, the wavelength of the third laser beam, and the wavelength of the fourth laser beam are different from one another.

14. The laser as claimed in claim 13, wherein
the first wavelength selective filter includes a first ring resonator, and is configured to select light of resonant wavelengths of the first ring resonator,
the second wavelength selective filter includes a second ring resonator, and is configured to select light of resonant wavelengths of the second ring resonator,
the third wavelength selective filter includes a third ring resonator, and is configured to select light of resonant wavelengths of the third ring resonator,
the fourth wavelength selective filter includes a fourth ring resonator, and is configured to select light of resonant wavelengths of the fourth ring resonator, and
the fifth wavelength selective filter includes a fifth ring resonator, and is configured to select light of resonant wavelengths of the fifth ring resonator.

15. The laser as claimed in claim 14, wherein an interval of the resonant wavelengths of each of the first ring resonator, the second ring resonator, the third ring resonator, and the fourth ring resonator is different from an interval of the resonant wavelengths of the fifth ring resonator.

16. The laser as claimed in claim 14, wherein
the first wavelength selective mirror includes a sixth ring resonator and a total reflection mirror, and is configured to reflect light of resonant wavelengths of the sixth ring resonator,
the second wavelength selective mirror includes a seventh ring resonator and a total reflection mirror, and is configured to reflect light of resonant wavelengths of the seventh ring resonator,
the third wavelength selective mirror includes an eighth ring resonator and a total reflection mirror, and is configured to reflect light of resonant wavelengths of the eighth ring resonator, and
the fourth wavelength selective mirror includes a ninth ring resonator and a total reflection mirror, and is configured to reflect light of resonant wavelengths of the ninth ring resonator.

17. The laser as claimed in claim 16, wherein the resonant wavelengths of each of the first ring resonator, the second ring resonator, the third ring resonator, the fourth ring resonator, the fifth ring resonator, the sixth ring resonator, the seventh ring resonator, the eighth ring resonator, and the ninth ring resonator are variable.

18. The laser as claimed in claim 14, wherein
a full width at half maximum of the resonant wavelengths of the first ring resonator is less than or equal to a difference between an interval of the resonant wavelengths of the first ring resonator and an interval of the resonant wavelengths of the fifth ring resonator,
a full width at half maximum of the resonant wavelengths of the second ring resonator is less than or equal to a difference between an interval of the resonant wavelengths of the second ring resonator and an interval of the resonant wavelengths of the fifth ring resonator,
a full width at half maximum of the resonant wavelengths of the third ring resonator is less than or equal to a difference between an interval of the resonant wavelengths of the third ring resonator and an interval of the resonant wavelengths of the fifth ring resonator, and
a full width at half maximum of the resonant wavelengths of the fourth ring resonator is less than or equal to a difference between an interval of the resonant wavelengths of the fourth ring resonator and an interval of the resonant wavelengths of the fifth ring resonator.

19. The laser as claimed in claim 14, wherein an interval of the resonant wavelengths of each of the first ring resonator, the second ring resonator, the third ring resonator, and the fourth ring resonator is minutely different from n times an interval of the resonant wavelengths of the fifth ring resonator, where n is an integer greater than or equal to two.

20. The laser as claimed in claim 14, wherein the first ring resonator, the second ring resonator, the third ring resonator, the fourth ring resonator, and the fifth ring resonator are formed of silicon waveguides.

21. The laser as claimed in claim 13, wherein
a wavelength at which a wavelength of the selected light of the first wavelength selective filter and a wavelength of the selected light of the fifth wavelength selective filter match is different from wavelengths of the selected light of each of the second wavelength selective filter and the third wavelength selective filter, and is reflected from
the second wavelength selective mirror and is not reflected from the third wavelength selective mirror, a wavelength at which a wavelength of the selected light of the second wavelength selective filter and a wavelength of the selected light of the fifth wavelength selective filter match is different from wavelengths of the selected light of each of the first wavelength selective filter and the fourth wavelength selective filter, and is reflected from the first wavelength selective mirror and is not reflected from the fourth wavelength selective mirror,
a wavelength at which a wavelength of the selected light of the third wavelength selective filter and a wavelength of the selected light of the fifth wavelength selective filter match is different from wavelengths of the selected light of each of the first wavelength selective filter and the fourth wavelength selective filter, and is reflected from the fourth wavelength selective mirror and is not reflected from the first wavelength selective mirror, and
a wavelength at which a wavelength of the selected light of the fourth wavelength selective filter and a wavelength of the selected light of the fifth wavelength selective filter match is different from wavelengths of the selected light of each of the second wavelength selective filter and the third wavelength selective filter, and is reflected from the third wavelength selective mirror and is not reflected from the second wavelength selective mirror.

22. The laser as claimed in claim 13, wherein
the wavelength of the first laser beam is a wavelength at which a wavelength of the selected light of the first wavelength selective filter and a wavelength of the selected light of the fifth wavelength selective filter match, and the wavelength of the first laser beam is different from wavelengths of the selected light of each of the second wavelength selective filter and the third wavelength selective filter, and is reflected from the second wavelength selective mirror and is not reflected from the third wavelength selective mirror,
the wavelength of the second laser beam is a wavelength at which a wavelength of the selected light of the second wavelength selective filter and a wavelength of the selected light of the fifth wavelength selective filter match, and the wavelength of the second laser beam is different from wavelengths of the selected light of each of the first wavelength selective filter and the fourth wavelength selective filter, and is reflected from the first wavelength selective mirror and is not reflected from the fourth wavelength selective mirror,
the wavelength of the third laser beam is a wavelength at which a wavelength of the selected light of the third wavelength selective filter and a wavelength of the selected light of the fifth wavelength selective filter match, and the wavelength of the third laser beam is different from wavelengths of the selected light of each of the first wavelength selective filter and the fourth wavelength selective filter, and is reflected from the fourth wavelength selective mirror and is not reflected from the first wavelength selective mirror, and
the wavelength of the fourth laser beam is a wavelength at which a wavelength of the selected light of the fourth wavelength selective filter and a wavelength of the selected light of the fifth wavelength selective filter match, and the wavelength of the fourth laser beam is different from wavelengths of the selected light of each of the second wavelength selective filter and the third wavelength selective filter, and is reflected from the third wavelength selective mirror and is not reflected from the second wavelength selective mirror.

23. The laser as claimed in claim 13, wherein each of the first wavelength selective filter, the second wavelength selective filter, the third wavelength selective filter, and the fourth wavelength selective filter includes a plurality of ring resonators having different intervals of resonant wavelengths.

24. The laser as claimed in claim 13, further comprising:
a first optical detector configured to detect an amount of light of a part of the first laser beam;
a second optical detector configured to detect an amount of light of a part of the first laser beam transmitted through an etalon;
a third optical detector configured to detect an amount of light of the second laser beam;
a fourth optical detector configured to detect an amount of light of the third laser beam;
a fifth optical detector configured to detect an amount of light of the fourth laser beam; and
a controller configured to control an oscillation wavelength of each of the first laser beam, the second laser beam, the third laser beam, and the fourth laser beam based on the amounts of light detected in the first optical detector, the second optical detector, the third optical detector, the fourth optical detector, and the fifth optical detector,
wherein each of the first gain medium, the second gain medium, the third gain medium, the fourth gain medium, and the fifth gain medium is a semiconductor optical amplifier.

25. A method of controlling a laser, the laser including a first gain medium having a partially reflecting mirror provided at a first end face of the first gain medium, a second gain medium having a partially reflecting mirror provided at a first end face of the second gain medium, a third gain medium having a partially reflecting mirror provided at a first end face of the third gain medium, a fourth gain medium having a partially reflecting mirror provided at a first end face of the fourth gain medium, a first wavelength selective filter, a second wavelength selective filter, a third wavelength selective filter, a fourth wavelength selective filter, a fifth wavelength selective filter, a first wavelength selective mirror, a second wavelength selective mirror, a third wavelength selective mirror, and a fourth wavelength selective mirror, wherein a wavelength of a first laser beam emitted from the first end face of the first gain medium, a wavelength of a second laser beam emitted from the first end face of the second gain medium, a wavelength of a third laser beam emitted from the first end face of the third gain medium, and a wavelength of a fourth laser beam emitted from the first end face of the fourth gain medium are different from one another, each of the first wavelength selective filter, the second wavelength selective filter, the third wavelength selective filter, the fourth wavelength selective filter, and the fifth wavelength selective filter includes a first input/output port, a second input/output port, a third input/output port, and a fourth input/output port, where the first input/output port and the second input/output port are connected and the third input/output port and the fourth input/output port are connected with respect to selected light that is selected wavelengths, and the first input/output port and the third input/output port are connected and the second input/output port and the fourth input/output port are connected with respect to non-selected light, the fifth wavelength selective filter is configured to select lights of periodic wavelengths, the first input/output port of the first wavelength selective filter is connected to a second end face of the first gain medium, the first input/output port of the second wavelength selective filter is connected to a second end face of the second gain medium, the first input/output port of the third wavelength selective filter is connected to a second end face of the third gain medium, the first input/output port of the fourth wavelength selective filter is connected to a second end face of the fourth gain medium, the first wavelength selective mirror is connected to the fourth input/output port of the first wavelength selective filter, the second wavelength selective mirror is connected to the fourth input/output port of the second wavelength selective filter, the third wavelength selective mirror is connected to the fourth input/output port of the third wavelength selective filter, the fourth wavelength selective mirror is connected to the fourth input/output port of the fourth wavelength selective filter, the second input/output port of the first wavelength selective filter is connected to the first input/output port of the fifth wavelength selective filter, the second input/output port of the second wavelength selective filter is connected to the second input/output port of the fifth wavelength selective filter, the second input/output port of the third wavelength selective filter is connected to the third input/output port of the fifth wavelength selective filter, and the second input/output port of the fourth wavelength selective filter is connected to the fourth input/output port of the fifth wavelength selective filter, the method comprising:

controlling the wavelength of the first laser beam, the wavelength of the second laser beam, the wavelength of the third laser beam, and the wavelength of the fourth laser beam, so that the wavelength of the first laser beam is a wavelength at which a wavelength of the selected light of the first wavelength selective filter and a wavelength of the selected light of the fifth wavelength selective filter match, and the wavelength of the first laser beam is different from wavelengths of the selected light of each of the second wavelength selective filter and the third wavelength selective filter, and is reflected from the second wavelength selective mirror and is not reflected from the third wavelength selective mirror, the wavelength of the second laser beam is a wavelength at which a wavelength of the selected light of the second wavelength selective filter and a wavelength of the selected light of the fifth wavelength selective filter match, and the wavelength of the second laser beam is different from wavelengths of the selected light of each of the first wavelength selective filter and the fourth wavelength selective filter, and is reflected from the first wavelength selective mirror and is not reflected from the fourth wavelength selective mirror, the wavelength of the third laser beam is a wavelength at which a wavelength of the selected light of the third wavelength selective filter and a wavelength of the selected light of the fifth wavelength selective filter match, and the wavelength of the third laser beam is different from wavelengths of the selected light of each of the first wavelength selective filter and the fourth wavelength selective filter, and is reflected from the fourth wavelength selective mirror and is not reflected from the first wavelength selective mirror, and the wavelength of the fourth laser beam is a wavelength at which a wavelength of the selected light of the fourth wavelength selective filter and a wavelength of the selected light of the fifth wavelength selective filter match, and the wavelength of the fourth laser beam is different from wavelengths of the selected light of each of the second wavelength selective filter and the third wavelength selective filter, and is reflected from the third wavelength selective mirror and is not reflected from the second wavelength selective mirror.

\* \* \* \* \*